(12) United States Patent
Shinohara et al.

(10) Patent No.: US 7,683,368 B2
(45) Date of Patent: Mar. 23, 2010

(54) METHOD OF MANUFACTURING SEMICONDUCTOR ELEMENT, SEMICONDUCTOR ELEMENT, ELECTRONIC DEVICE, AND ELECTRONIC EQUIPMENT

(75) Inventors: Takashi Shinohara, Suwa (JP); Yuji Shinohara, Suwa (JP); Koichi Terao, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 156 days.

(21) Appl. No.: 11/918,437

(22) PCT Filed: Apr. 18, 2006

(86) PCT No.: PCT/JP2006/308674

§ 371 (c)(1),
(2), (4) Date: Oct. 12, 2007

(87) PCT Pub. No.: WO2006/112537

PCT Pub. Date: Oct. 26, 2006

(65) Prior Publication Data

US 2009/0032807 A1 Feb. 5, 2009

(30) Foreign Application Priority Data

Apr. 18, 2005 (JP) .............................. 2005-119328

(51) Int. Cl.
*H01L 51/40* (2006.01)
*H01L 51/48* (2006.01)
*H01L 51/56* (2006.01)
*H01L 51/00* (2006.01)

(52) U.S. Cl. .............................. 257/40; 257/23; 257/81; 257/E51.033; 257/E51.027; 257/E51.026; 438/22; 438/29; 438/82; 438/99

(58) Field of Classification Search .................. 438/22, 438/29, 82, 99; 257/23, 40, 81, E51.024, 257/E51.026, E51.027, E51.033, E51.034, 257/E51.035, E51.038
See application file for complete search history.

(56) References Cited

U.S. PATENT DOCUMENTS 5,929,194 A * 7/1999 Woo et al. .................... 528/229
(Continued)

FOREIGN PATENT DOCUMENTS

EP 0 996 176 A1 4/2000
(Continued)

OTHER PUBLICATIONS

Y. Zhang et al. "Photo-Crosslinkable Polymers as Hole-Transport Materials for Organic Light-Emitting Diodes", Journal of Materials Chemistry, vol. 12, (May 3, 2002) pp. 1703-1708.
(Continued)

*Primary Examiner*—A. Sefer
*Assistant Examiner*—Ermias Woldegeorgis
(74) *Attorney, Agent, or Firm*—Oliff & Berridge, PLC

(57) ABSTRACT

The object of the present invention is to provide a method of manufacturing a semiconductor element which can produce a semiconductor element provided with a semiconductor layer having a high carrier transport ability, a semiconductor element manufactured by the semiconductor element manufacturing method, an electronic device provided with the semiconductor element, and electronic equipment having a high reliability. In order to achieve the object, the present invention is directed to a method of manufacturing a semiconductor element having an anode, a cathode, and a hole transport layer provided between the anode and the cathode, the method comprising steps of: a first step for forming layers mainly comprised of a hole transport material having polymerizable groups X on the side of one surface of the anode and on the side of one surface of the cathode, respectively, and a second step for obtaining the hole transport layer by integrating the two layers together by polymerizing the hole transport materials via a polymerization reaction through their polymerizable groups in a state that the layer on the side of the anode and the layer on the side of the cathode are made contact with each other.

14 Claims, 6 Drawing Sheets

U.S. PATENT DOCUMENTS

| | | | |
|---|---|---|---|
| 5,965,979 A | 10/1999 | Friend et al. | |
| 6,340,789 B1 | 1/2002 | Petritsch et al. | |
| 2002/0053401 A1* | 5/2002 | Ishikawa et al. | 156/309.3 |
| 2005/0009227 A1* | 1/2005 | Xiao et al. | 438/82 |

FOREIGN PATENT DOCUMENTS

| | | |
|---|---|---|
| JP | A-09-007763 | 1/1997 |
| JP | A-2002-203675 | 7/2002 |

OTHER PUBLICATIONS

M. Granstr,öm et al., "Laminated Fabrication of Polymeric Photovoltaic Diodes", Nature, vol. 395, (Sep. 17, 1998) pp. 257-260.

B. Domercq et al., "Photo-Patternable Hole-Transport Polymers for Organic Light-Emitting Diodes", Chemistry of Materials, vol. 15, No. 7, (Mar. 15, 2003) pp. 1491-1496.

M. Bayer et al., "Crosslinkable Hole-Transport Materials for Preparation of Multilayer Organic Light Emitting Devices by Spin-Coating", Macromolecular: Rapid Communications, vol. 20, No. 4, (1999) pp. 224-228.

* cited by examiner

METHOD OF MANUFACTURING SEMICONDUCTOR ELEMENT, SEMICONDUCTOR ELEMENT, ELECTRONIC DEVICE, AND ELECTRONIC EQUIPMENT

CROSS-REFERENCE TO RELATED APPLICATION

This application claims a priority to Japanese Patent Application No. 2005-119328 filed on Apr. 18, 2005 which is hereby expressly incorporated by reference herein in its entirety.

BACKGROUND OF THE INVENTION

1. Field of the Invention

The present invention relates to a method of manufacturing a semiconductor element, a semiconductor element, an electronic device, and electronic equipment, and more specifically relates to a method of manufacturing a semiconductor element, a semiconductor element manufactured by the semiconductor element manufacturing method, an electronic device provided with the semiconductor element, and electronic equipment provided with the electronic device.

2. Description of the Prior Art

As a semiconductor element having a plurality of organic layers, there are known an organic electroluminescent device (hereinafter, simply referred to as an "organic EL device") and an organic thin film transistor and the like.

In particular, the organic EL devices have been extensively developed in expectation of their use as solid-state luminescent devices or emitting devices for use in inexpensive large full-color displays.

In general, such an organic EL device has a structure in which a light emitting layer is provided between a cathode and an anode. When an electric field is applied between the cathode and the anode, electrons are injected into the light emitting layer from the cathode side, and holes are injected into the light emitting layer from the anode side.

The injected electrons and holes are recombined in the light emitting layer, which then causes their energy level to return from the conduction band to the valence band. At this time, excitation energy is released as light energy so that the light emitting layer emits light.

In such organic EL devices, it has been known that a layered device structure, in which organic layers formed of organic materials having different carrier transport properties for electrons or holes are provided between a light emitting layer and a cathode and/or an anode, is effective in obtaining a high-efficiency organic EL device with high luminance.

For this purpose, it is necessary to laminate a light emitting layer and organic layers having different carrier transport properties (hereinafter, these layers are collectively referred to as "organic layers") on the electrode. In the conventional manufacturing method of an organic EL device, a laminate in which such organic layers are sequentially laminated is first formed on an anode by means of a liquid phase process, and then a cathode made of a metal material is formed on a surface of the laminate which is opposite to the surface thereof on which the anode is provided by means of a liquid phase process, to thereby form an organic EL device.

However, in such a manufacturing method, it is difficult to form a laminate by laminating respective organic layers so that each layer has an uniform film thickness, and in particular it is difficult to form a cathode having an uniform film thickness on the laminate by means of a liquid phase process.

Further, when such a cathode is formed by means of a liquid phase process, the laminate which has been in advance formed is likely to be degraded or deteriorated due to a high energy applied upon the formation of the cathode. As a result, variations in the film thicknesses of the respective organic layers and formation of pin holes are likely to occur, thereby leading to the case that properties of the organic EL devices such as luminescent efficiency and the like are lowered.

In order to solve the above described problems, there are known the following methods (which are disclosed in JP-A No. 9-7763 and JP-A No. 2002-203675). Specifically, these publications disclose a method of forming an organic EL device which comprises the steps of: (I) organic layers are laminated on an anode and a cathode, respectively, (II) the surfaces of these organic layers which do not face the anode and the cathode are made contact with each other, and (III) the surfaces of the organic layers are bonded so that they are integrated.

More specifically, in the method disclosed in JP-A No. 9-7763, a curing resin is added to a constituent material of the organic layers to be bonded so that the curing agent functions as a resin binder, to thereby bond the organic layers together.

However, this method involves a problem in that a carrier transport ability of the organic layers is lowered due to the affect of the added resin binder.

Further, in the method disclosed in JP-A 2002-203675, after organic layers to be bonded are melted in a state that these layers are in contact with each other, these organic layers are cured again so as to bond the organic layers.

However, this method involves a problem in that a sufficient adhesion cannot be obtained between the bonding surfaces so that a carrier transport ability of the organic layers can not be sufficiently improved.

The problems described above may also been raised in organic thin film transistors.

SUMMARY OF THE INVENTION

It is therefore an object of the present invention to provide a method of manufacturing a semiconductor element provided with a semiconductor layer having a high carrier transport ability, a semiconductor element manufactured by the semiconductor manufacturing method, an electronic device provided with the semiconductor element, and electronic equipment having high reliability.

In order to achieve the above objects, the present invention is directed to a method of manufacturing a semiconductor element having a first electrode, a second electrode, and a semiconductor layer provided between the first electrode and the second electrode, the method comprising the steps of: a first step for forming layers mainly comprised of a semiconductor material having polymerizable groups on the side of one surface of the first electrode and on the side of one surface of the second electrode, respectively, and a second step for obtaining the semiconductor layer by integrating the two layers together by polymerizing the semiconductor materials via a polymerization reaction through their polymerizable groups in a state that the layer on the side of the first electrode and the layer on the side of the second electrode are made contact with each other.

According to the semiconductor element manufacturing method described above, it is possible to manufacture a semiconductor element provided with a semiconductor layer having an excellent carrier transport ability.

In the semiconductor element manufacturing method according to the present invention, it is preferred that the layer on the side of first electrode is formed by means of a liquid phase process in the first step.

This makes it possible to form the layer on the side of the first electrode while preventing a reaction of polymerizable groups of the semiconductor material and degradation of the polymerizable groups appropriately.

Further, in the semiconductor element manufacturing method according to the present invention, it is preferred that the layer on the side of the second electrode is formed by means of a liquid phase process in the first step.

This makes it possible to form the layer on the side of the second electrode while preventing a reaction of polymerizable groups of the semiconductor material and degradation of the polymerizable groups appropriately.

Further, in the semiconductor element manufacturing method according to the present invention, it is also preferred that the method further comprises between the first step and the second step a step for polymerizing the semiconductor material contained in the layer on the side of the first electrode to such an extent that the degree of polymerization thereof is lower than the degree of polymerization of the polymer obtained in the second step.

According to this method, it is possible to make the layer on the side of the first electrode to be a semisolid state or solid state reliably. With this result, when the two layers are placed so as to face to each other, it is possible to position these layers more easily while appropriately preventing a part of the layer on the side of the first electrode from being dropped.

Furthermore, in the semiconductor element manufacturing method according to the present invention, it is also preferred that the method further comprises between the first step and the second step a step for polymerizing the semiconductor material contained in the layer on the side of the second electrode to such an extent that the degree of polymerization thereof is lower than the degree of polymerization of the polymer obtained in the second step.

According to this method, it is possible to make the layer on the side of the second electrode to be a semisolid state or solid state reliably. With this result, when the two layers are placed so as to face to each other, it is possible to position these layers more easily while appropriately preventing a part of the layer on the side of the second electrode from being dropped.

Furthermore, in the semiconductor element manufacturing method according to the present invention, it is preferred that the polymerizable groups have photopolymerization properties.

According to this method, it is possible to easily polymerize the polymerizable groups by irradiation of light.

Alternatively, in the semiconductor element manufacturing method according to the present invention, it is also preferred that the polymerizable groups have heat polymerization properties.

According to this method, it is possible to easily polymerize the polymerizable groups by applying heat thereto.

In this case, it is preferred that the method further comprises a step of forming at least one organic material layer which is different from the semiconductor layer between the first electrode and the second electrode, wherein a heating temperature for polymerizing the polymerizable groups is set to a temperature which is lower than a glass transition temperature of a main material constituting the organic material layer.

With this result, it is possible to reliably prevent the organic material layer from being melted when the heat treatment is carried out. This also makes it possible to reliably prevent the properties of the organic material layer from being decreased due to recrystallization of the main material constituting the organic material layer when a heat removal treatment is carried out after the heat treatment.

Furthermore, in the semiconductor element manufacturing method according to the present invention, it is preferred that the semiconductor material is comprised of a compound which is represented by the following general formula (A1) or (A2):

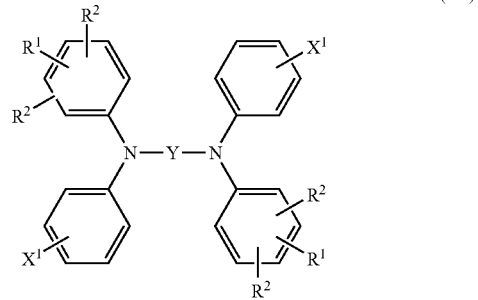

(A1)

wherein two $R^1$s are the same or different and each independently represents a straight-chain alkyl group having 2 to 8 carbon atoms, and four $R^2$s are the same or different and each independently represents a hydrogen atom, a methyl group or an ethyl group, Y represents a group containing at least one substituted or unsubstituted aromatic hydrocarbon ring or substituted or unsubstituted heterocycle, and two $X^1$s are the same kind of substituent represented by any one of the following general formulas (B1) to (B3), in which the number of carbon atoms of the two $X^1$s are the same as or different from to each other; or

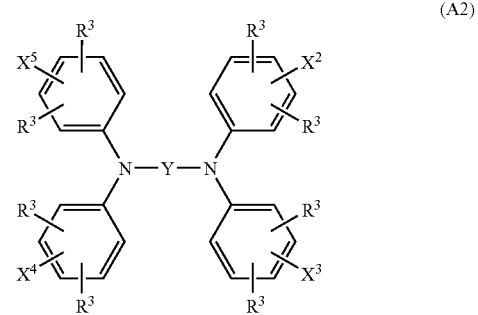

(A2)

wherein eight Rs are the same or different and each independently represents a hydrogen atom, a methyl group, or an ethyl group, Y represents a group containing at least one substituted or unsubstituted aromatic hydrocarbon ring or substituted or unsubstituted heterocycle, and $X^2$, $X^3$, $X^4$ and $X^5$ are the same kind of substituent which is represented by any one of the following general formulas (B1) to (B3), in which the number of carbon atoms of $X^2$, $X^3$, $X^4$ and $X^5$ are the same as or different from to each other.

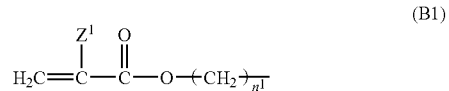

(B1)

-continued

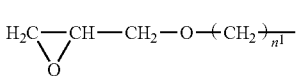

(B2)

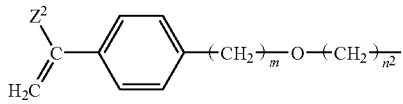

(B3)

wherein $n^1$ is an integer of 2 to 8, $n^2$ is an integer of 3 to 8, m is an integer of 0 to 3, $Z^1$ represents a hydrogen atom or a methyl group, and $Z^2$ represents a hydrogen atom, a methyl group or an ethyl group.

By using such a compound, it is possible to form a semiconductor layer in which the two layers are reliably integrated together. Further, since a polymer obtained by the polymerization reaction of each compound has a high carrier transport ability, the semiconductor layer to be formed can also exhibit a higher carrier transport ability.

In the above semiconductor element manufacturing method according to the present invention, it is preferred that the semiconductor layer includes a hole transport layer. This makes it possible to form a hole transport layer having a good adhesion between the two layers, so that the thus formed hole transport layer can exhibit an excellent hole transport ability.

Further, in the above semiconductor element manufacturing method according to the present invention, it is also preferred that the semiconductor layer includes a light emitting layer. This makes it possible to form a light emitting layer having a good adhesion between the two layers, so that the thus formed light emitting layer can have excellent light emitting properties.

Furthermore, in the above semiconductor element manufacturing method according to the present invention, it is also preferred that the semiconductor layer includes an electron transport layer. This makes it possible to form an electron transport layer having a good adhesion between the two layers, so that the thus formed electron transport layer can exhibit an excellent electron transport ability.

Another aspect of the present invention is directed to a semiconductor element manufactured by the semiconductor element manufacturing method described above. Such a semiconductor element can be provided with a semiconductor layer having an excellent carrier transport ability.

Other aspect of the present invention is directed to an electronic device provided with the semiconductor element as described above. Such an electronic device can have a high reliability.

Still other aspect of the present invention is directed to electronic equipment provided with the electronic device mentioned above. Such electronic equipment can also have high reliability.

These and other objects, structures and advantages of the present invention will be apparent upon reading the following detailed description of the invention and the examples thereof with reference to the accompanying drawings.

BEST MODE FOR CARRYING OUT THE INVENTION

Hereinbelow, a method of manufacturing a semiconductor element, a semiconductor element, an electronic device, and electronic equipment according to the present invention will be described in detail with reference to preferred embodiments shown in the accompanying drawings.

It is to be noted that the following description will be made with regard to one representative case where the semiconductor element of the present invention is embodied as an organic electroluminescent device (hereinafter, simply ref erred to as "organic EL device" or "organic EL element").

<<Organic EL Device>>

Figure 1:
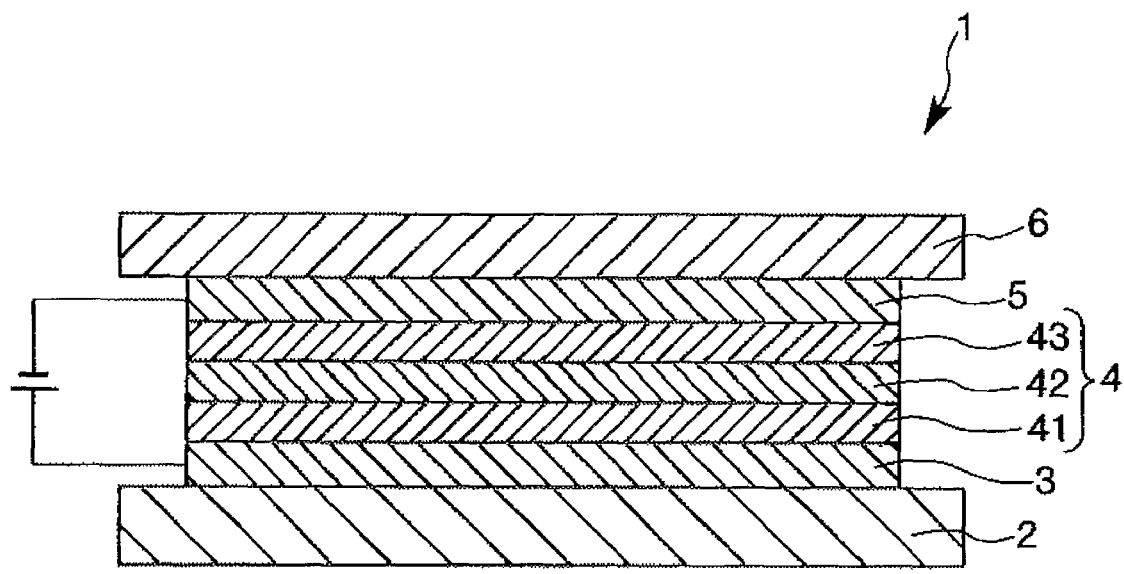
FIG. 1 is a cross-sectional view which shows an embodiment of an organic EL device which is one example of a semiconductor element according to the present invention.

FIG. 1 is a cross-sectional view which shows an example of an organic EL device.

In the following description, the upper side in FIG. 1 will be referred to as "upper" or "upper side" and the lower side thereof will be referred to as "lower" or "lower side".

The organic EL device 1 shown in FIG. 1 includes a first substrate 2, an anode 3 provided on the first substrate 2, an EL layer 4 provided on the anode 3, a cathode 5 provided on the EL layer 4 and a second substrate 6 provided on the cathode 5. Further, a protection layer not shown in the drawing is provided so as to cover the side surfaces of the respective layers 3, 4 and 5.

The substrate 2 and the substrate 6 serve as supports for the organic EL device 1, and the layers described above are formed between these first and second substrates 2 and 6.

As a constituent material of the substrate 2 and the substrate 6, a material having a light-transmitting property and a good optical property (that is, transparent and colorless, colored and transparent, or translucent) can be preferably used.

Examples of such a material include various resins such as polyethylene terephthalate, polyethylene naphthalate, polypropylene, cycloolefin polymer, polyamide, polyethersulfone, polymethylmethacrylate, polycarbonate, and polyarylate, and various glass materials, and the like. At least one of these materials can be used as the constituent material.

The first substrate 2 and the second substrate 6 may be formed of the same constituent material or different constituent materials.

The average thickness of each of the substrate 2 and substrate 6 is not particularly limited, but is preferably in the range of about 0.1 to 30 mm, and more preferably in the range of about 0.1 to 10 mm.

In this regard, it is to be noted that in the case where the organic EL device 1 has a structure in which light is emitted from the side of the first substrate 2 (that is, a bottom emission type), the second substrate 6 and the cathode 5 are not required to have transparency. On the other hand, in the case where the organic EL device 1 has a structure in which light is emitted from the side of the second substrate 6 (that is, a top emission type), the first substrate 2 and the anode 3 are not required to have transparency.

For these reasons, according to the structure of the organic EL device 1, a substrate made of a ceramic material such as alumina, a substrate comprising a metal substrate base such as stainless steel and an oxide film (insulation film) provided on the metal substrate, or an opaque substrate such as a substrate made of an opaque resin material may be selectively used for the substrate 2 or the substrate 6.

The anode 3 (the first electrode) is an electrode which injects holes into the EL layer 4 (that is, into a hole transport layer 41 described later). As the constituent material of the anode 3 (hereinafter, referred to as "anode material"), a material having a high work function and excellent conductivity is preferably used.

Examples of such an anode material include oxides such as ITO (Indium Tin Oxide), $SnO_2$, Sb-containing $SnO_2$, and Al-containing ZnO, Au, Pt, Ag, Cu, and alloys containing two or more of them. At least one of these materials can be used as an anode material.

The average thickness of the anode 3 is not limited to any specific value, but is preferably in the range of about 10 to 200 nm, more preferably in the range of about 50 to 150 nm. If the thickness of the anode 3 is too thin, there is a case that a function of the anode 3 will not be sufficiently exhibited. On the other hand, if the anode 3 is too thick, there is a case that the light transmittance will be significantly lowered depending on, for example, the kind of anode material used, thus resulting in an organic EL device that is not suitable for practical use in the case where the organic EL device is of the bottom emission type.

It is to be noted that conductive resins such as polythiophene, polypyrrole, and the like can also be used as the anode material.

On the other hand, the cathode 5 (the second electrode) is an electrode which injects electrons into the EL layer 4 (that is, into an electron transport layer 43 described later).

As a constituent material of the cathode 5 (hereinafter, referred to as "cathode material"), a material having a low work function is preferably used.

Examples of such a cathode material include Li, Mg, Ca, Sr, La, Ce, Er, Eu, Sc, Y, Yb, Ag, Cu, Al, Cs, Rb, and alloys containing two or more of them. At least one of these materials can be used as a cathode material.

Particularly, in the case where an alloy is used as a cathode material, an alloy containing a stable metallic element such as Ag, Al, or Cu, specifically an alloy such as MgAg, AlLi, or CuLi is preferably used. The use of such an alloy as a cathode material makes it possible to improve the electron injection efficiency and stability of the cathode 5.

The average thickness of the cathode 5 is preferably in the range of about 1 nm to 1 µm, and more preferably in the range of about 100 to 400 nm. If the thickness of the cathode 5 is too thin, there is a case that a function of the cathode 5 will not be sufficiently exhibited. On the other hand, if the cathode 5 is too thick, there is a case that the light emitting efficiency of the organic EL device 1 will be lowered, thus resulting in an organic EL device that is not suitable for practical use in the case where the organic EL device is of the top emission type.

The EL layer 4 is provided between the anode (first electrode) 3 and the cathode (second electrode) 5. The EL layer 4 includes the hole transport layer 41, the light emitting layer 42, and the electron transport layer 43. These layers 41, 42 and 43 are formed on the anode 3 in this order.

The hole transport layer 41 has a function of transporting holes, which are injected from the anode 3, to the light emitting layer 42.

In this embodiment, the hole transport layer 41 is formed by integrating or uniting a layer 41' provided on the first substrate 2 and a layer 41' provided on the second substrate 6 together in the process of the organic EL element manufacturing method described later. Specifically, layers 41' each of which is formed of a constituent material containing as its main material a hole transport material (semiconductor material) having polymerizable groups X are formed on the side of the substrate 2 and on the side of the substrate 6, respectively. The polymerizable groups X of the hole transport materials in the respective layers 41' are polymerized in a state that these layers 41' are made contact with each other. As a result, the hole transport material is polymerized so as to integrate or unite the two layers 41' together, thereby forming a hole transport layer 41.

Since the hole transport layer 41 is formed through the process described above, a link structure formed by the polymerization of the polymerizable groups X exists at the vicinity of the boundary (bonding surfaces) between the two layers 41' joined. As a result, the two layers 41' are chemically linked or bonded to each other through the link structure so that the hole transport layer 41 can have excellent adhesion at the vicinity of the boundary between the layers 41'. As a result, an organic EL element 1 having such a hole transport layer 41 can exhibit excellent characteristics.

Various materials can be used as the hole transport material (semiconductor material) if they have a hole transport ability and also have polymerizable groups X for linking the semiconductor materials of the layers 41'. As such hole transport materials having a hole transport ability, conjugated compounds are preferably used. Such conjugated compounds can transport holes especially smoothly due to a characteristic derived from its unique spread of the electron cloud, and therefore such compounds can have an especially excellent hole transport ability.

Examples of such compounds include: thiophene/styrenesulfonic acid-based compounds such as 3,4-ethylenedioxythiophene/styrenesulfonic acid; arylcycloalkane-based compounds such as 1,1-bis(4-di-para-triaminophenyl)cyclohexane and 1,1'-bis(4-di-para-tolylaminophenyl)-4-phenylcyclohexane; arylamine-based compounds such as 4,4',4''-trimethyltriphenylamine, N,N,N',N'-tetraphenyl-1,1'-biphenyl-4,4'-diamine, N,N'-diphenyl-N,N'-bis(3-methylphenyl)-1,1'-biphenyl-4,4'-diamine (TPD1), N,N'-diphenyl-N,N'-bis(4-methoxyphenyl)-1,1'-biphenyl-4,4'-diamine (TPD2), N,N,N',N'-tetrakis(4-methoxyphenyl)-1,1'-biphenyl-4,4'-diamine (TPD3), N,N'-di(1-naphthyl)-N,N'-diphenyl-1,1'-biphenyl-4,4'-diamine (α-NPD), and TPTE; phenylenediamine-based compounds such as N,N,N',N'-tetraphenyl-para-phenylenediamine, N,N,N',N'-tetra(para-tolyl)-para-phenylenediamine, and N,N,N',N'-tetra(meta-tolyl)-meta-phenylenediamine (PDA); carbazole-based compounds such as carbazole, N-isopropylcarbazole, and N-phenylcarbazole; stilbene-based compounds such as stilbene, and 4-di-para-tolylaminostilbene; oxazole-based compounds such as $O_xZ$; triphenylmethane-based compounds such as triphenylmethane, and m-MTDATA; pyrazoline-based compounds such as 1-phenyl-3-(para-dimethylaminophenyl)pyrazoline; benzine(cyclohexadiene)-based compounds; triazole-based compounds such as triazole; imidazole-based compounds such as imidazole; oxadiazole-based compounds such as 1,3,4-oxadiazole, and 2,5-di(4-dimethylaminophenyl)-1,3,4-oxadiazole; anthracene-based compounds such as anthracene, and 9-(4-diethylaminostyryl)

anthracene; fluorenone-based compounds such as fluorenone, 2,4,7-trinitro-9-fluorenone, and 2,7-bis(2-hydroxy-3-(2-chlorophenylcarbamoyl)-1-naphthylazo)fluorenone; aniline-based compounds such as polyaniline; silane-based compounds; thiophene-based compounds such as polythiophene, and poly(thiophenevinylene); pyrrole-based compounds such as poly(2,2'-thienylpyrrole), and 1,4-dithioketo-3,6-diphenyl-pyrrolo-(3,4-c)pyrrolopyrrole; florene-based compounds such as florene; porphyrin-based compounds such as porphyrin, and metal tetraphenylporphyrin; quinacridon-based compounds such as quinacridon; metallic or non-metallic phthalocyanine-based compounds such as phthalocyanine, copper phthalocyanine, tetra(t-butyl)copper phthalocyanine, and iron phthalocyanine; metallic or non-metallic naphthalocyanine-based compounds such as copper naphthalocyanine, vanadyl naphthalocyanine, and monochloro gallium naphthalocyanine; and benzidine-based compounds such as N,N'-di(naphthalene-1-yl)-N,N'-diphenyl-benzidine and N,N,N',N'-tetraphenylbenzidine. Polymers formed from these compounds also have a higher hole transport ability.

As the hole transport material used in the present invention, compounds obtained by introducing the polymerizable groups X into any one or more of the above-mentioned compounds are preferably used.

The polymerizable groups X mentioned above are not limited to a specific type if they can be polymerized (linked) to each other, but polymerizable groups having photopolymerization properties or heat polymerization properties are preferably used.

When such photopolymerization type polymerizable groups X are used, it is possible to polymerize the polymerizable groups X easily by irradiation of light.

Examples of such a polymerizable group X include a substituent having at an end thereof a (meth)acryloyl group, a vinyl group, an epoxy group, a diazo group, or a dithiocarbamate group, or the like. These substituents have excellent photopolymerization properties.

Further, when heat polymerization type polymerizable groups X are used, it is possible to polymerize the polymerizable groups X easily by applying heat.

Examples of such a polymerizable group X include a substituent having at an end thereof an epoxy group or the like. These substituents have excellent heat polymerization properties.

Further, as the hole transport material, a compound represented by the following general formula (A1) or (A2) and having a hole transport ability may be used.

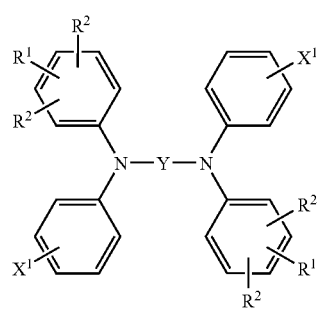

(A1)

wherein two $R^1$s are the same or different and each independently represents a straight-chain alkyl group having 2 to 8 carbon atoms, four $R^2$s are the same or different and each independently represents a hydrogen atom, a methyl group or an ethyl group, Y represents a group containing at least one substituted or unsubstituted aromatic hydrocarbon ring or substituted or unsubstituted heterocycle, and two $X^1$s are the same kind of substituent represented by any one of the following general formulas (B1) to (B3), in which the number of carbon atoms of the two $X^1$s are the same as or different from to each other; or

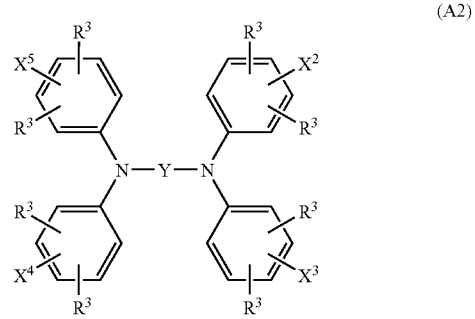

(A2)

wherein eight Rs are the same or different and each independently represents a hydrogen atom, a methyl group, or an ethyl group, Y represents a group containing at least one substituted or unsubstituted aromatic hydrocarbon ring or substituted or unsubstituted heterocycle, and $X^2$, $X^3$, $X^4$ and $X^5$ are the same kind of substituent which is represented by any one of the following general formulas (B1) to (B3), in which the number of carbon atoms of $X^2$, $X^3$, $X^4$ and $X^5$ are the same as or different from to each other.

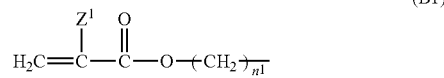

(B1)

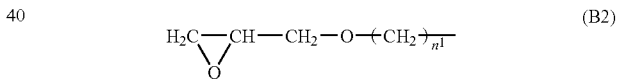

(B2)

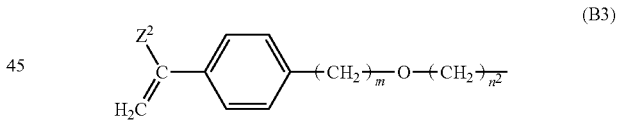

(B3)

wherein $n^1$ is an integer of 2 to 8, $n^2$ is an integer of 3 to 8, m is an integer of 0 to 3, $Z^1$ represents a hydrogen atom or a methyl group, and $Z^2$ represents a hydrogen atom, a methyl group or an ethyl group.

Details of these compounds will be described later.

Furthermore, it is also preferred that the hole transport material has a volume resistance of 10 Ω·cm or more, and preferably $10^2$ Ω·cm or more. This makes it possible to obtain an EL device having a high luminescent efficiency.

An average thickness of the hole transport layers 41 is not limited to any specific value, but it is preferably in the range of about 10 to 150 nm, and more preferably in the range of about 50 to 100 nm. If the thickness of the hole transport layer 41 is too thin, there is a possibility that pin holes are formed. On the other hand, if the thickness of the hole transport layer 41 is too thick, it may result in a reduced transmittance of the hole transport layer 41, thus leading to the case where chromaticity (hue) of emitted light is adversely changed.

The electron transport layer 43 is a layer having the function of transporting electrons injected from the cathode 5 into the light emitting layer 42.

Examples of a material that can be used for the electron transport layer 43 include: benzene-based compounds (starburst-based compounds) such as 1,3,5-tris[(3-phenyl-6-trifluoromethyl)quinoxaline-2-yl] benzene (TPQ1), and 1,3,5-tris[{3-(4-t-butylphenyl)-6-trisfluoromethyl}quinoxaline-2-yl]benzene (TPQ2); naphthalene-based compounds such as naphthalene; phenanthrene-based compounds such as phenanthrene; chrysene-based compounds such as chrysene; perylene-based compounds such as perylene; anthracene-based compounds such as anthracene; pyrene-based compounds such as pyrene; acridine-based compounds such as acridine; stilbene-based compounds such as stilbene; thiophene-based compounds such as BBOT; butadiene-based compounds such as butadiene; coumarin-based compounds such as coumarin; quinoline-based compounds such as quinoline; bistyryl-based compounds such as bistyryl; pyrazine-based compounds such as pyrazine and distyrylpyrazine; quinoxaline-based compounds such as quinoxaline; benzoquinone-based compounds such as benzoquinone, and 2,5-diphenyl-para-benzoquinone; naphthoquinone-based compounds such as naphthoquinone; anthraquinone-based compounds such as anthraquinone; oxadiazole-based compounds such as oxadiazole, 2-(4-biphenylyl)-5-(4-t-butylphenyl)-1,3,4-oxadiazole (PBD), BMD, BND, BDD, and BAPD; triazole-based compounds such as triazole, and 3,4,5-triphenyl-1,2,4-triazole; oxazole-based compounds; anthrone-based compounds such as anthrone; fluorenone-based compounds such as fluorenone, and 1,3,8-trinitro-fluorenone (TNF); diphenoquinone-based compounds such as diphenoquinone, and MBDQ; stilbenequinone-based compounds such as stilbenequinone, and MBSQ; anthraquinodimethane-based compounds; thiopyran dioxide-based compounds; fluorenylidenemethane-based compounds; diphenyldicyanoethylene-based compounds; florene-based compounds such as florene; metallic or non-metallic phthalocyanine-based compounds such as phthalocyanine, copper phthalocyanine, and iron phthalocyanine; and various metal complexes such as 8-hydroxyquinoline aluminum ($Alq_3$), and complexes having benzooxazole or benzothiazole as a ligand. These compounds may be used singly or in combination of two or more of them.

In this regard, it is to be noted that compounds represented by the above-mentioned general formula (A1) and (A2) and polymers obtained by polymerization reaction of the compounds at their polymerizable groups, which can exhibit an electron transport ability, may be used as the electron transport material in addition to the electron transport materials mentioned above. Details of these compounds will be described later.

An average thickness of the electron transport layers 43 is not limited to any specific value, but it is preferably in the range of about 1 to 100 nm, and more preferably in the range of about 20 to 50 nm. If the thickness of the electron transport layer 43 is too thin, there is a possibility that pin holes are to be formed and thereby short circuit occurs. On the other hand, if the thickness of the electron transport layer 43 is too thick, there is a case that resistance value becomes high.

Here, when a current flows between the anode 3 and the cathode 5 (that is, a voltage is applied across the anode 3 and the cathode 5), holes emitted from the anode 3 are transported in the hole transport layer 41, and electrons emitted from the cathode 5 are transported in the electron transport layer 43, and finally the holes and the electrons are recombined in the light emitting layer 42. In the light emitting layer 42, excitons are produced by energy released upon the recombination, and the excitons release energy (in the form of fluorescence or phosphorescence) or emit light when returning to the ground state.

As a constituent material (light emitting material) of the light emitting layer 42, various materials can be used if, by using such materials, holes are injected into the light emitting layer 42 from the anode 3 and electrons are injected into the light emitting layer 42 from the cathode 5 when a voltage is applied across the anode 3 and the cathode 5 to thereby providing a filed in which the holes and the electrons can be recombined.

As such light emitting materials, there are various low molecular type light emitting materials and various high molecular type light emitting materials as mentioned hereinbelow, and at least one of these materials can be used.

In this regard, it is to be noted that when a low molecular type light emitting material is used, a dense light emitting layer can be obtained, thus enabling to increase a light emitting efficiency of the light emitting layer 42. On the other hand, when a high molecular type light emitting material is used, it is possible to form a light emitting layer 42 easily using any one of various application methods such as an ink-jet printing method and the like since such a material can be dissolved into a solvent relatively easily. Further, when the low molecular type light emitting material is used in combination with the high molecular type light emitting material, it is possible to obtain a synergistic effect of both the low molecular type light emitting material and the high molecular type light emitting material. That is to say, it is possible to obtain an effect that a dense light emitting layer 42 having a high luminescent efficiency can be easily formed by using various application methods such as an ink-jet printing method and the like.

Examples of such a low molecular type light emitting material include: benzene-based compounds such as distyrylbenzene (DSB), and diaminodistyrylbenzene (DADSB); naphthalene-based compounds such as naphthalene and Nile red; phenanthrene-based compounds such as phenanthrene; chrysene-based compounds such as chrysene and 6-nitro-chrysene; perylene-based compounds such as perylene and N,N'-bis(2,5-di-t-butylphenyl)-3,4,9,10-perylene-di-carboxy imide (BPPC); coronene-based compounds such as coronene; anthracene-based compounds such as anthracene and bisstyrylanthracene; pyrene-based compounds such as pyrene; pyran-based compounds such as 4-(di-cyanomethylene)-2-methyl-6-(para-dimethylaminostyryl)-4H-pyran (DCM); acridine-based compounds such as acridine; stilbene-based compounds such as stilbene; thiophene-based compounds such as 2,5-dibenzooxazolethiophene; benzooxazole-based compounds such as benzooxazole; benzoimidazole-based compounds such as benzoimidazole; benzothiazole-based compounds such as 2,2'-(para-phenylenedivinylene)-bisbenzothiazole; butadiene-based compounds such as bistyryl(1,4-diphenyl-1,3-butadiene) and tetraphenylbutadiene; naphthalimide-based compounds such as naphthalimide; coumarin-based compounds such as coumarin; perynone-based compounds such as perynone; oxadiazole-based compounds such as oxadiazole; aldazine-based compounds; cyclopentadiene-based compounds such as 1,2,3,4,5-pentaphenyl-1,3-cyclopentadiene (PPCP); quinacridone-based compounds such as quinacridone and quinacridone red; pyridine-based compounds such as pyrrolopyridine and thiadiazolopyridine; spiro compounds such as 2,2',7,7'-tetraphenyl-9,9'-spirobifluorene; metallic or nonmetallic phthalocyanine-based compounds such as phthalocyanine ($H_2Pc$) and copper phthalocyanine; florene-based compounds such as florene; and various metallic complexes such as 8-hydroxyquinoline aluminum ($Alq_3$), tris(4-methyl-8-quinolinolate) aluminum(III) ($Almq_3$), (8-hydroxyquinoline) zinc ($Znq_2$), (1,10-phenanthroline)-tris-(4,4,4-trifluoro-1-(2-thienyl)-butane-1,3-dionate) europium(III) ($Eu(TTA)_3$ (phen)), fac-tris(2-phenylpyridine) iridium ($Ir(ppy)_3$), and (2,3,7,8,12,13,17,18-octaethyl-21H,23H-porphin) platinum (II), and the like.

Further, examples of such a high molecular type light emitting material include polyacetylene-based compounds such as trans-type polyacetylene, cis-type polyacetylene, poly(diphenylacetylene) (PDPA), and poly(alkyl, phenylacetylene) (PAPA); polyparaphenylenevinylene-based compounds such as poly(para-phenylenevinylene) (PPV), poly(2,5-dialkoxy-para-phenylenevinylene) (RO-PPV), cyano-substituted-poly (para-phenylenevinylene) (CN-PPV), poly(2-dimethyloctylsilyl-para-phenylenevinylene) (DMOS-PPV), and poly(2-methoxy-5-(2'-ethylhexoxy)-para-phenylenevinylene)_ (MEH-PPV); polythiophene-based compounds such as poly (3-alkylthiophene) (PAT), and poly(oxypropylene)triol (POPT); polyfluorene-based compounds such as poly(9,9-dialkylfluorene) (PDAF), α,ω-bis[N,N'-di(methylphenyl) aminophenyl]-poly[9,9-bis(2-ethylhexyl)fluorene-2,7-diyl] (PF2/6am4), poly(9,9-dioctyl-2,7-divinylenefluorenyl)-altco(anthracene-9,10-diyl); polyparaphenylene-based compounds such as poly(para-phenylene) (PPP), and poly(1,5-dialkoxy-para-phenylene) (RO-PPP); polycarbazole-based compounds such as poly(N-vinylcarbazole) (PVK); and polysilane-based compounds such as poly(methylphenylsilane) (PMPS), poly(naphthylphenylsilane) (PNPS), and poly(biphenylylphenylsilane) (PBPS), and the like.

Further, in addition to the light emitting materials mentioned above, it is also possible to use the compound represented by the above-mentioned general formula (A1) or the above-mentioned general formula (A2) and polymers obtained by polymerization reaction of these compounds at their polymerizable groups, which have been described above with reference to the hole transport material, as the light emitting material depending on the kind of the hole transport material used in the hole transport layer 41 and the kind of the electron transport material used in the electron transport layer 43.

These compounds will be described later in details.

The average thickness of the light emitting layer 42 is not limited to any specific value, but is preferably in the range of about 10 to 150 nm, and more preferably in the range of about 50 to 100 nm. By setting the thickness of the light emitting layer to a value within the above range, recombination of holes and electrons occurs efficiently, thereby enabling the light emitting efficiency of the light emitting layer 42 to be further improved.

Although, in this embodiment, each of the light emitting layer 42, the hole transport layer 41, and the electron transport layer 43 is separately provided, they may be formed into a hole-transportable light emitting layer having the functions of both the hole transport layer 41 and the light emitting layer 42 or an electron-transportable light emitting layer having the functions of both the electron transport layer 43 and the light emitting layer 42. In these cases, an area in the vicinity of the boundary between the hole-transportable light emitting layer and the electron transport layer 43 or an area in the vicinity of the boundary between the electron-transportable light emitting layer and the hole transport layer 41 functions as the light emitting layer 42.

Further, in the case where the hole-transportable light emitting layer is used, holes injected from an anode into the hole-transportable light emitting layer are trapped by the electron transport layer, and in the case where the electron-transportable light emitting layer is used, electrons injected from a cathode into the electron-transportable light emitting layer are trapped in the electron-transportable light emitting layer. In both cases, there is an advantage in that the recombination efficiency of holes and electrons can be improved.

Further, an additional layer may be provided between the respective layers 3, 4 and 5 for any arbitral purpose. For example, a hole injection layer may be provided between the hole transport layer 41 and the anode 3, and an electron injection layer may be provided between the electron transport layer 43 and the cathode 5. In the case where such a hole injection layer is provided in the organic EL device 1, the hole injection layer may be formed of the hole transport material described above. Further, in the case where such an electron injection layer is provided in the organic EL device 1, the electron injection layer may be formed of alkali halide such as LiF and the like instead of the electron transport material described above.

As described above, the protection layer 6 is provided so as to cover the layers 3, 4 and 5 constituting the organic EL device 1. This protection layer 6 has the function of hermetically sealing the layers 3, 4 and 5 constituting the EL device 1 to shut off oxygen and moisture. By providing such a protection layer 6, it is possible to obtain the effect of improving the reliability of the organic EL device 1 and the effect of preventing the alteration and deterioration of the organic EL device 1.

Examples of a constituent material of the protection layer 6 include Al, Au, Cr, Nb, Ta and Ti, alloys containing them, silicon oxide, various resin materials, and the like. In this regard, it is to be noted that in the case where a conductive material is used as a constituent material of the protection layer 6, it is preferred that an insulating film is provided between the protection layer 6 and each of the layers 3, 4 and 5 to prevent a short circuit therebetween, as needed.

In this regard, it is to be noted that in the case where at least one of the first substrate 2 and the second substrate 6 has a flexibility, the side surfaces of the respective layers 3, 4 and 5 may be covered by the flexible substrate(s) to seal the layers so that the substrate 2 and/or the substrate 6 can exhibit a function of the protective layer.

The organic EL device 1 can be used for a display, for example, but it can also be used for various optical purposes such as a light source and the like.

In the case where the organic EL device 1 is used for a display, the drive system thereof is not particularly limited, and either of an active matrix system or a passive matrix system may be employed.

The organic EL device 1 as described above can be manufactured in the following manner, for example.

Figure 2:
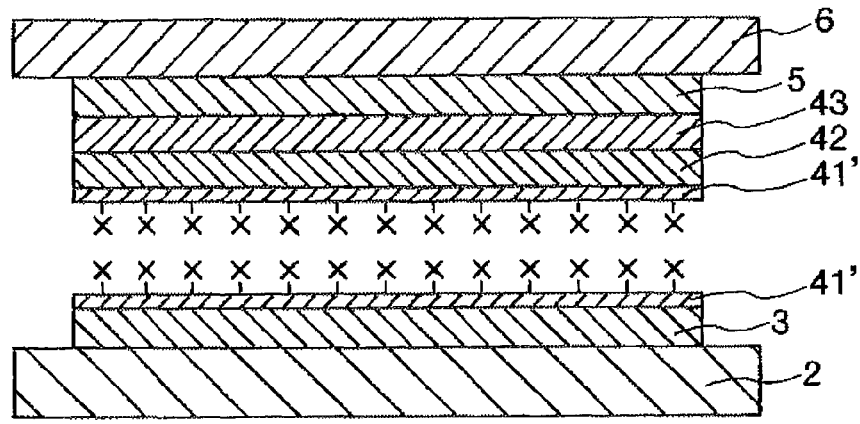
FIG. 2 (a) to (c) are schematic views for explaining the manufacturing method of the organic EL element shown in FIG. 1.
Figure 2:
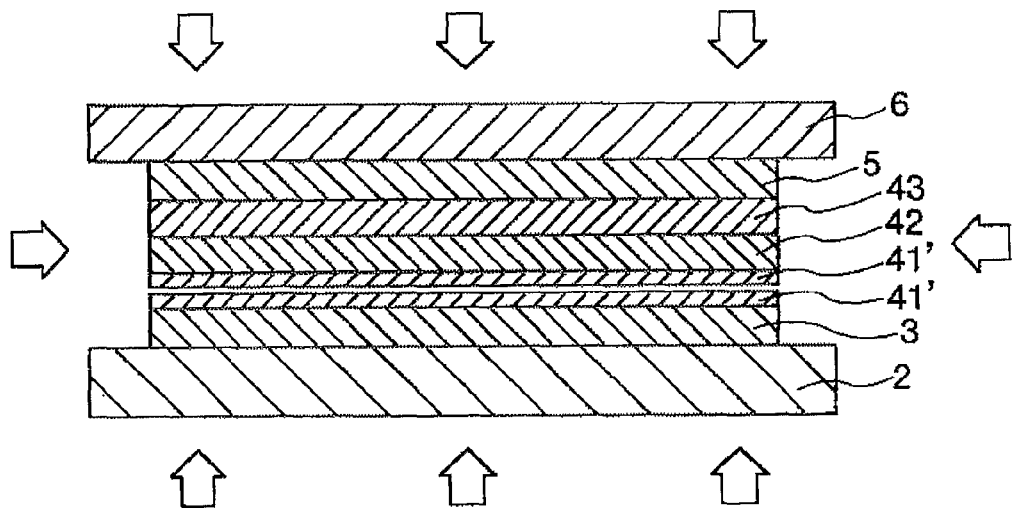
Figure 2:
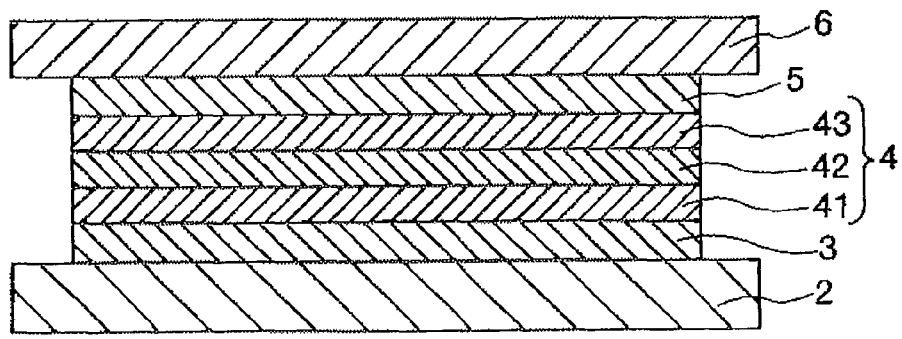

FIG. 2 (*a*) to (*c*) are schematic views (cross-sectional views) for explaining the manufacturing method of the organic EL element shown in FIG. 1.

[1] Step of Forming an Anode

First, a first substrate 2 is prepared, and then an anode 3 is formed on the substrate 2.

The anode 3 can be formed by, for example, chemical vapor deposition (CVD) such as plasma CVD, thermal CVD, and laser CVD, vacuum deposition, sputtering, dry plating such as ion plating, wet plating such as electrolytic plating, immersion plating, and electroless plating, thermal spraying, a sol-gel method, a MOD method, bonding of a metallic foil, or the like.

[2] Step of Forming a Cathode

Next, a second substrate 6 is prepared, and a cathode 5 is formed on the second substrate 6.

The cathode 5 can be formed by, for example, vacuum deposition, sputtering, bonding of a metallic foil, or the like.

[3] Step of Forming an Electron Transport Layer

Next, an electron transport layer 43 is formed on the cathode 5.

The electron transport layer 43 can be formed by supplying a liquid state electron transport layer formation material which is obtained by dissolving the electron transport material into a solvent or dispersing it in a dispersion medium onto the cathode 5 by an application method or the like, and then removing the solvent or the dispersion medium from the electron transport layer formation material.

As the solvent or dispersion medium used for preparing the electron transport layer formation material, it is possible to use the same solvents or dispersion mediums as those which will be explained later with reference to the hole transport layer formation step [5].

Further, as the application method, it is possible to use the same methods as those which will be explained later with reference to the hole transport layer formation step [5].

[4] Step of Forming a Light Emitting Layer

Next, a light emitting layer 42 is formed on the electron transport layer 43.

The light emitting layer 42 may be formed in the same manner as the electron transport layer 43 mentioned above. Namely, the light emitting layer 42 can be formed of the light emitting materials mentioned above using the method explained with reference to the electron transport layer formation step [3] described above.

[5] Step of Forming a Hole Transport Layer

Next, a hole transport layer 41 is formed between the anode 3 and the light emitting layer 42 using the substrate 2 which is provided with the anode 3 which has been formed in the above-described step [1] and the second substrate 6 on which the cathode 5, the electron transport layer 43 and the light emitting layer 42 are laminated in this order which have been formed in the above-described steps [2] to [4]. Such a hole transport layer 41 may be formed through the following steps, for example.

[5-1] A liquid state hole transport layer formation material obtained by dissolving the hole transport material (semiconductor material) in a solvent or dispersing it in a dispersion medium is prepared.

Examples of such a solvent or dispersion medium include: inorganic solvents such as nitric acid, sulfuric acid, ammonia, hydrogen peroxide, water, carbon disulfide, carbon tetrachloride, and ethylene carbonate; and various organic solvents such as ketone-based solvents e.g., methyl ethyl ketone (MEK), acetone, diethyl ketone, methyl isobutyl ketone (MIBK), methyl isopropyl ketone (MIPK), and cyclohexanone, alcohol-based solvents e.g., methanol, ethanol, isopropanol, ethylene glycol, diethylene glycol (DEG), and glycerol, ether-based solvents e.g., diethyl ether, diisopropyl ether, 1,2-dimethoxy ethane (DME), 1,4-dioxane, tetrahydrofuran (THF), tetrahydropyran (THP), anisole, diethylene glycol dimethyl ether (diglyme), and diethylene glycol ethyl ether (Carbitol), cellosolve-based solvents e.g., methyl cellosolve, ethyl cellosolve, and phenyl cellosolve, aliphatic hydrocarbon-based solvents e.g, hexane, pentane, heptane, and cyclohexane, aromatic hydrocarbon-based solvents e.g., toluene, xylene, and benzene, aromatic heterocyclic compound-based solvents e.g., pyridine, pyrazine, furan, pyrrole, thiophene, and methylpyrrolidone, amide-based solvents e.g., N,N-dimethylformamide (DMF) and N,N-dimethylacetamide (DMA), halogen compound-based solvents e.g., dichloromethane, chloroform, and 1,2-dichloroethane, ester-based solvents e.g., ethyl acetate, methyl acetate, and ethyl formate, sulfur compound-based solvents e.g., dimethyl sulfoxide (DMSO) and sulfolane, nitrile-based solvents e.g., acetonitrile, propionitrile, and acrylonitrile, organic acid-based solvents e.g., formic acid, acetic acid, trichloroacetic acid, and trifluoroacetic acid, and mixed solvents containing them.

Further, it is preferred that a polymerization initiator is added to the hole transport layer formation material in addition to the hole transport material. This makes it possible to promote polymerization reaction via the polymerizable groups X by subjecting the material to heat treatment or light irradiation treatment in the later step [5-5].

Examples of a polymerization initiator include, but are not limited thereto, photopolymerization initiators such as radical photopolymerization initiators and cationic photopolymerization initiators, heat polymerization initiators, and anaerobic polymerization initiators.

Examples of such heat polymerization initiators include azobisisobutyronitrile (AIBN), benzoyl peroxide, isophthalic acid dihydrazide, and the like.

Further, examples of such cationic photopolymerization initiators include onium salt-based cationic photopolymerization initiators such as aromatic sulfouium salt-based cationic photopolymerization initiators, aromatic iodonium salt-based cationic photopolymerization initiators, aromatic diazonium cationic photopolymerization initiators, pyridium salt-based cationic photopolymerization initiators, and aromatic phosphonium salt-based cationic photopolymerization initiators; and nonionic cationic photopolymerization initiators such as iron arene complex and sulfonate ester.

Furthermore, examples of such radical photopolymerization initiators include benzophenone-based radical photopolymerization initiators, benzoin-based radical photopolymerization initiators, acetophenone-based radical photopolymerization initiators, benzylketal-based radical photopolymerization initiators, Michler's keton-based radical photopolymerization initiators, acylphosphine oxide-based radical photopolymerization initiators, ketocoumarin-based radical photopolymerization initiators, xanthene-based radical photopolymerization initiators, and thioxanthone-based radical photopolymerization initiators.

Further, in the case where a photopolymerization initiator is used as a polymerization initiator, a sensitizer suitable for the photopolymerization initiator to be used may be added to the hole transport layer formation material.

[5-2]

Next, by supplying the hole transport layer formation material onto each of the anode 3 and the light emitting layer 42, layers 41' are formed on the anode 3 and the light emitting layer 42, respectively (hereinafter, this step will be referred to as "first step"). Each of the layers 41' is constituted from a material containing the hole transport material having polymerizable groups X as its main material.

By adjusting the thickness of each of the layers 41', it is possible to adjust the thickness of the hole transport layer 41 to be formed.

These layers 41' may be formed using various methods, but it is preferred that these layers are formed using a liquid phase process as described below.

Specifically, it is preferred that (1) the hole transport layer formation material is supplied onto the anode 3 and the light emitting layer 43, respectively, by means of a liquid phase process, to thereby form liquid state coating layers (coating films), and then (2) the solvent or dispersion medium is removed from the liquid state coating layers to thereby form layers 41' which is constituted from a material containing as its main material the hole transport material. According to this method, it is possible to form the layers 41' while preventing a reaction of the polymerizable groups X of the hole transport material and degradation of the polymerizable groups X appropriately.

Examples of such a liquid phase process include a spin coating method, a casting method, a micro gravure coating method, a gravure coating method, a bar coating method, a roll coating method, a wire-bar coating method, a dip coating method, a spray coating method, a screen printing method, a flexographic printing method, an offset printing method, an ink-jet printing method, and the like. By using such a liquid phase process, it is possible to relatively easily supply the hole transport layer formation material onto the anode 3 and the light emitting layer 42, respectively, to form the liquid state coating layers.

Examples of the method for removing the solvent or dispersion medium include, but not limited thereto, forcedly removing methods such as a method for heating, a method for drying in vacuum or under reduced pressure, and a method for blowing an inactivated gas, and the like, besides a natural drying in air.

[5-3]

Next, the hole transport material contained in the layers 41' respectively formed on the anode 3 and the light emitting layer 42 is polymerized to such an extent that the degree of polymerization thereof is lower than the degree of polymerization of the polymer of the hole transport material contained in the hole transport layer 41 to be formed.

Consequently, the respective layers 41' are made to be a semisolid state or solid state reliably. With this result, when these layers 41' are placed so as to face to each other at the subsequent step [5-4], it is possible to position these layers 41' more easily while preventing a part of the layers 41' from being dropped on the anode 3 or the light emitting layer 42 appropriately.

Further, by forming these layers 41' to be such a semi-solid state or solid state, it is possible to improve a shape stability of these layers 41'. Consequently, it is possible to keep the thickness of each of the layers 41' stably when these layers 41' are made contact with each other at the subsequent step [5-4]. That is, it is possible to prevent variations in the thickness of each layer 41' reliably, so that a hole transport layer 41 having an uniform thickness can be formed. As a result, the moving distances of holes in the hole transport layer 41 in its thickness direction become substantially the same as to each other, and this makes it possible for holes injected from the anode 3 substantially at the same time to reach the boundary between the hole transport layer 41 and the light emitting layer 42 substantially at the same time. Thus, it is possible to prevent color unevenness from being caused in an organic EL element 1 to be obtained.

In this regard, it is to be noted that in order to polymerize the hole transport material so as to have a degree of polymerization lower than that of the hole transport layer 41 to be formed, the hole transport material is reacted under conditions which are more gradual than the conditions for polymerizing the hole transport material to form the hole transport material at the later step [5-5].

Further, this step [5-3] may be performed on one of the layers 41' formed on the anode 3 and the light emitting layer 42. Namely, this step [5-3] may be performed on only a layer 41' of a substrate which is placed so that its layer 41' faces underside in a vertical direction in the subsequent step [5-4] (in this embodiment, the layer 41' provided on the side of the second substrate 6, that is, on the light emitting layer 42).

Further, in the case where the layers 41' obtained by removing the solvent or dispersion medium in the previous step [5-2] were already in a semi-solid state or a solid state, this step [5-3] may be omitted.

[5-4] Next, as shown in FIG. 2(*a*), by placing the second substrate 6 so that its layer 41' faces underside in a vertical direction, the layer 41' provided on the light emitting layer 42 is allowed to face the layer 41' provided on the anode 3.

[5-5] Next, as shown in FIG. 2(*b*), these layers 41' are made contact with each other while positioning the layer 41' formed on the light emitting layer 42 with respect to the layer 41' formed on the anode 3. In such a state, the polymerizable groups X are polymerized so that the hole transport material is polymerized to be a polymer. In this way, a hole transport material in the vicinity of the contacting surfaces between the layers 41' is polymerized so that these layers 41' are integrated or united together as shown in FIG. 2(*c*) to thereby form the hole transport layer 41 (hereinafter, this step will be referred to as "second process").

The thus formed hole transport material 41 has a structure in which the layers 41' are chemically linked or bonded to each other through the link structure formed by polymerization reaction of the polymerizable groups X at the contacting surface or bonding surface between the layers 41' so that the excellent adhesion is exhibited. As a result, the hole transport layer 41 can have an excellent hole transport ability.

Further, the degree of polymerization of the hole contained transport material in each layer 41' is lower than the degree of polymerization of a polymer of the hole transport material contained in the hole transport layer 41 to be formed. This means that unreacted polymerizable groups X still remain in each of the layers 41' before these layers 41' are integrated. Accordingly, at substantially the same time of polymerization of the polymerizable groups X in the vicinity of the contacting surfaces, unreacted polymerizable groups X remaining in each layer 41' are also polymerized. With this result, the hole transport material becomes a polymer not only in the vicinity of the contacting surfaces between the layers 41' but also in the inside of each of the layers 41' at substantially the same time. This means that the same polymer exits homogeneously throughout the thus formed hole transport layer 41. Consequently, the contacting surfaces of the two layers 41' are hardly recognized in the hole transport layer 41. This makes it possible to reliably suppress or prevent variations in the hole transport ability from being caused in the obtained hole transport material 41.

Further, according to the semiconductor element manufacturing method of the present invention, it is possible to obtain the hole transport layer 41 without mixing impurities such as a resin binder thereinto, so that it is possible to prevent the hole transport ability of the hole transport layer 41 from being decreased reliably.

In the above embodiment, when the two layers 41' are made contact with each other, the second substrate 6 may be pressed against the first substrate 2, if necessary. In this way, it is possible to polymerize the polymerizable groups X existing in the vicinity of the surfaces of the respective layers 41' more reliably, so that the two layers 41' can be integrated more reliably.

Various methods may be mentioned as a method for polymerizing the polymerizable groups. Examples of such a method include a method for irradiating light, a heating method, an anaerobic treatment method, and the like. Among these methods, a heating method is preferably used. By using such a method, the entire of each layer 41' can be treated uniformly, and thus it is possible to appropriately prevent differences in the hole transport ability from being created in various portions in the hole transport layer 41.

When the heating method is employed, the heating temperature is set to a temperature at which the polymerizable groups X can be polymerized though it is not limited to any specific temperature. However, it is preferred that the heating temperature is set to a temperature lower than the glass transition temperature of the main material constituting adjacent layers other than the hole transport layer 41, that is, the glass transition temperatures of the main materials constituting the light emitting layer 42 and the electron transport layer 43. With this result, it is possible to reliably prevent the light emitting layer 42 and the electron transport layer 43 from being melted when the heat treatment is carried out. This also makes it possible to reliably prevent the properties of the light emitting layer 42 and the electron transport layer 43 from being decreased due to recrystallization of the main materials constituting these layers 42, 43 when a heat removal treatment is carried out after the heat treatment.

In more details, the heating temperature is preferably in the range of about 50 to 200° C., and more preferably in the range of about 70 to 150° C.

Further, the heating time is preferably in the range of about 5 to 90 minutes, and more preferably in the range of about 5 to 60 minutes.

When a method for irradiating light is used, infrared ray, visible ray, ultraviolet ray, X-ray and the like can be used as the light for irradiating the layers 41', and these rays may be used alone or in combination of two or more of them. Among these rays, an ultraviolet ray is particularly preferably used. This makes it possible to progress polymerization reaction between the polymerizable groups X easily and reliably.

In this connection, the wavelength of the ultraviolet ray used for the irradiation is preferably in the range of about 200 to 420 nm, and more preferably in the range of about 250 to 400 nm.

Further, the intensity of irradiation of the ultraviolet ray is preferably in the range of about 10 to 5000 mW/cm$^2$, and more preferably in the range of about 20 to 1000 mW/cm$^2$.

Furthermore, the irradiation time of the ultraviolet ray is preferably in the range of 5 to 300 seconds, and more preferably in the range of 10 to 150 seconds.

By setting the wavelength, the intensity of irradiation and the irradiation time of the ultraviolet ray into the above ranges, it is possible to control the polymerization process of the hole transport material contained in each of the layers 41' relatively easily.

[6] Step of Forming a Protection Layer

Next, a protection layer 6 is formed so as to cover the side surfaces of the anode 3, the EL layer 4, and the cathode 5, that is, a portion exposed from between the first substrate 2 and the second substrate 6.

The protection layer 6 can be formed or provided by, for example, supplying a liquid state material containing the above described material or its precursor to an area in which the protection layer 6 is to be formed by an application method described above, and then drying the supplied liquid.

The EL device 1 is manufactured through these steps as described above.

In the above embodiment, a description was made with regard to the case where the hole transport layer 41 is formed by integrating the two layers 41', but the present invention is not limited thereto. A layer formed by integrating two layers 41' may be the light emitting layer 42 or the electron transport layer 43.

In the case where the light emitting layer 42 is formed by integrating two layers, a material that can be used as a light emitting material is selected from compounds obtained by introducing substituents X into the light emitting material or a compound represented by the above-mentioned general formula (A1) or the above-mentioned general formula (A2), and the thus formed two layers are integrated together using the method described with reference to the hole transport layer formation step [5].

Further, in the case where the electron transport layer 43 is formed by integrating two layers together, a material that can be used as an electron transport material is selected from compounds obtained by introducing substituents X into the electron transport material or a compound represented by the above-mentioned general formula (A1) or the above-mentioned general formula (A2), and the two layers are integrated together using the method described with reference to the hole transport layer formation step [5].

<Compounds Represented by General Formulas (A1) and (A2)>

Hereinbelow, a description will be made with regard to the compounds represented by the following general formula (A1) (hereinafter, simply referred to as "compound (A1)") and the compound represented by the following general formula (A2) (hereinafter, simply referred to as "compound (A2)") which have been referred in the above descriptions with reference to the hole transport material, the light emitting material and the electron transport material.

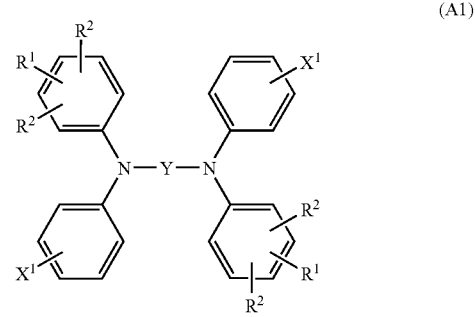

(A1)

wherein two R$^1$s are the same or different and each independently represents a straight-chain alkyl group having 2 to 8 carbon atoms, and four R$^2$s are the same or different and each independently represents a hydrogen atom, a methyl group or an ethyl group, Y represents a group containing at least one substituted or unsubstituted aromatic hydrocarbon ring or substituted or unsubstituted heterocycle, and two X$^1$s are the same kind of substituent represented by any one of the following general formulas (B1) to (B3), in which the number of carbon atoms of the two X$^1$s are the same as or different from to each other; or

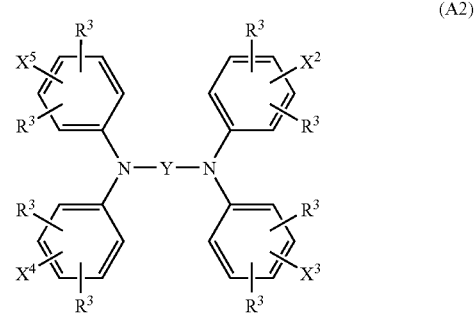

(A2)

wherein eight Rs are the same or different and each independently represents a hydrogen atom, a methyl group, or an ethyl group, Y represents a group containing at least one substituted or unsubstituted aromatic hydrocarbon ring or substituted or unsubstituted heterocycle, and $X^2$, $X^3$, $X^4$ and $X^5$ are the same kind of substituent which is represented by any one of the following general formulas (B1) to (B3), in which the number of carbon atoms of $X^2$, $X^3$, $X^4$ and $X^5$ are the same as or different from to each other.

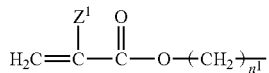
(B1)

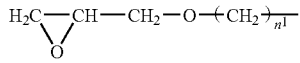
(B2)

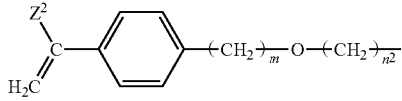
(B3)

wherein $n^1$ is an integer of 2 to 8, $n^2$ is an integer of 3 to 8, m is an integer of 0 to 3, $Z^1$ represents a hydrogen atom or a methyl group, and $Z^2$ represents a hydrogen atom, a methyl group or an ethyl group.

In this regard, it is to be noted that in the compound (A1) the term "polymerizable group X" represents a substituent $X^1$, and in the compound (A2) the term "polymerizable group X" represents each of the substituent $X^2$, and the substituent $X^3$ the substituent $X^4$ and the substituent $X^5$ (hereinbelow, they will be collectively referred to as the substituents $X^2$ to $X^5$ on occasions).

Since each of the compound (A1) and the compound (A2) has the substituents described above as its polymerizable groups X, it is possible to use each of these compounds (A1) and (A2) as a semiconductor material contained in layers for forming a semiconductor layer when the semiconductor layer is formed by integrating or uniting these layers together.

Further, although each of the compound (A1) and the compound (A2) can exhibit an excellent carrier transport ability even in the state that it is not polymerized at its polymerizable groups X, a polymer obtained by the polymerization reaction of each compound through its polymerizable groups X can exhibit a higher carrier transport ability.

For this reason, by using such a polymer obtained by the polymerization reaction of the compound (A1) or the compound (A2) as a main material of the semiconductor layer, the thus formed semiconductor layer can also exhibit a higher carrier transport ability.

Hereinbelow, a description will be made with regard to the features of the polymers.

Each of the polymers is obtained by a polymerization reaction of the compound (A1) or the compound (A2) (which is a diphenylamine derivative) through its polymerizable groups X, that is, a polymer in which main skeletons (a diphenylamine skeleton) which is a portion of each compound other than its polymerizable groups X are linked via a chemical structure formed by the reaction between the polymerizable groups X thereof (hereinafter, this chemical structure is referred to as "a link structure").

First, a description will be made with regard to a polymer obtained from the compound (A1).

In a polymer obtained by a polymerization reaction of the compound (A1) via its substituents X1 (that is, a substituent $X^1$ of a compound (A1) and a substituent $X^1$ of a compound (A1)), the polymer has a structure in which the main skeletons of the compounds are repeatedly linked via the link structure, that is, a structure in which the main skeletons repeatedly exist at a predetermined interval. Therefore, the interaction between the adjacent main skeletons decreases.

Further, each main skeleton has a conjugated chemical structure, and a unique spread of the electron cloud thereof contributes to smooth transportation of carriers (holes or electrons) in the polymer.

For this reason, the polymer exhibits a high carrier transport ability. Therefore, a semiconductor layer obtained by using such a polymer as its main material also has a high carrier transport ability.

In this regard, it is to be noted that if the interval between the main skeletons in the polymer is too small, interaction between the adjacent main skeletons tends to be strong. On the other hand, if the interval between the main skeletons in the polymer is too large, it becomes difficult to transfer carriers between the main skeletons, causing the carrier transport ability of the polymer to be impaired.

Therefore, it is preferred that the structure of the substituent $X^1$ is determined in view of these facts mentioned above. Specifically, in the case where a substituent represented by the above general formula (B1) or (B2) is selected as the substituent $X^1$, it is preferred that the substituent $X^1$ has a straight-chain carbon to carbon link in which $n^1$ is 2 to 8, in particular 3 to 6. Further, in the case where a substituent represented by the above general formula (B3) is selected as the substituent $X^1$, it is preferred that the substituent $X^1$ has a straight-chain carbon to carbon link in which $n^2$ is 3 to 8 and m is 0 to 3, in particular $n^2$ is 4 to 6 and m is 1 or 2.

By satisfying the above relation, it becomes possible for the adjacent main skeletons to exist at a suitable interval, thereby decreasing the interaction between the adjacent main skeletons in the polymer reliably. In addition, it is also possible to transfer carriers between the main skeletons more reliably so that the polymer can also have a high carrier transport ability.

In this connection, in the case where a substituent represented by the above general formula (B1) or (B2) is selected as the substituent $X^1$, each substituent $X^1$ has a (meth)acryloyl group or an epoxy group as its end. Since each of the (meth)acryloyl group and the epoxy group has high reactivity and bonding stability, it is relatively easy to polymerize substituents $X^1$ directly to thereby form a polymer having a long chain length.

Further, the link structure obtained by polymerization reaction via the (meth)acryloyl groups has two double bonds (π bonds) each existing between an oxygen atom and a carbon atom. Therefore, even in the case where the interval between the main skeletons becomes relatively long, transfer of carriers between the main skeletons can be carried out reliably through the two π bonds (that is, conjugated bonds).

Furthermore, since a straight-chain carbon to carbon link (i.e., an alkylene group) exists between each of the two π bonds and each main skeleton, it is possible to prevent or suppress the interaction between the main skeletons from being enhanced.

Moreover, the link structure obtained by polymerization reaction of the epoxy groups has ether links (bonds) and a straight-chain carbon to carbon link (i.e., alkylene groups). In such a link structure having the above structure, transfer of electrons is suppressed. Therefore, even in the case where the interval between the adjacent main skeletons is relatively small, it is possible to prevent or suppress the interaction between the main skeletons from being enhanced.

In this connection, it is to be noted that if the link structure has a structure having many conjugated π bonds such as a benzene ring, interaction occurs between the adjacent main skeletons through such a structure, which cancels the effect obtained by allowing the adjacent main skeletons to exist at a suitable interval.

In this regard, however, in the case where a substituent represented by the general formula (B3) is selected as the substituent $X^1$, the substituent $X^1$ has a styrene derivative group formed by introducing a substituent $Z^2$ to a styrene group as its functional group at one end thereof. Therefore, benzene rings exist in the link structure.

As a result, in the case where each of the benzene rings and each of the main skeletons having a conjugated chemical structure are too close to each other, that is, in the case where the benzene ring is linked to the main skeleton via an ether bond or in the case where the total of $n^2$ and m is two, interaction occurs between the adjacent main skeletons through the benzene rings.

However, in this polymer, the linkage between the main skeleton and the benzene ring is formed by $n^2$ and m the total of which is three or more, that is three or more methylene groups and an ether bond exist therebetween. This makes it possible to maintain the interval between the main skeleton and the benzene ring at a suitable condition. With this result, it is possible to prevent or suppress interaction from occurring between the adjacent main skeletons appropriately.

Further, the substituent $Z^2$ is a hydrogen atom, a methyl group or an ethyl group, wherein the substituent $Z^2$ is selected in accordance with the total of $n^2$ and m, that is the total number of methylene groups.

For example, in the case where the total number is small, a methyl group or an ethyl group is selected as the substituent $Z^2$. Since a methyl group and an ethyl group are an electron-releasing substituent, it is possible to bias electrons to the side of the main skeleton by selecting a methyl group or an ethyl group as the substituent $Z^2$. With this result, it is possible to prevent appropriately interaction from occurring between the adjacent main skeletons which are existed through the benzene rings.

Because of the reasons stated in the above, it is preferred that the two substituents $X^1$ have substantially the same number of carbon atoms, and more preferably exactly the same number of carbon atoms. In such a case, the interval between the adjacent main skeletons can be made substantially constant. Therefore, it is possible to prevent uneven distribution of the electron density from occurring in the polymer, thereby enabling a carrier transport ability of the polymer to be improved.

Furthermore, it is to be noted that the substituent $X^1$ may be bonded to the 2-, 3-, 4-, 5- or 6-position of the benzene ring, but preferably bonded to the 3-, 4- or 5-position. This makes it possible to more conspicuously exhibit the effect obtained by linking the adjacent main skeletons via the substituents $X^1$. Namely, it is possible for the adjacent main skeletons to exist at a suitable interval more reliably.

The substituent $R^1$ has a straight-chain alkyl group having 2 to 8 carbon atoms, preferably 3 to 6 carbon atoms. This makes it possible for adjacent polymers to exist at a suitable interval since the adjacent polymers are prevented from closely approaching to each other by steric hindrance of the substituents $R^1$. As a result, it becomes possible to reliably decrease the interaction between the adjacent main skeletons of different polymers in a semiconductor layer to be formed, thereby enabling the semiconductor layer to have a high carrier transport ability.

Preferably, the two substituents $R^1$ contain substantially the same number of carbon atoms, more preferably the same number of carbon atoms. This makes it possible for the adjacent polymers to exist at an interval of a certain distance in the semiconductor layer. As a result, the density of polymers in the semiconductor layer becomes uniform.

Further, the substituent $R^1$ may be bonded to any of the 2- to 6-position of a benzene ring, but preferably it is bonded to the 4-position. This makes it possible to exhibit the effect of introduction of the substituents $R^1$ more conspicuously. Namely, it is possible to reliably prevent the adjacent polymers from closely approaching to each other.

Furthermore, as described above, the substituent $R^2$ is a hydrogen atom, a methyl group, or an ethyl group, and the substituent $R^2$ is selected in accordance with the number of carbon in the substituent $R^1$. Specifically, when the number of carbon in the substituent $R^1$ is large, a hydrogen atom is selected as the substituent $R^2$, while when the number of carbon in the substituent $R^1$ is small, a methyl group or an ethyl group is selected as the substituent $R^2$.

In the compound (A1), it is possible to change the carrier transport properties of the polymer to be formed by appropriately setting the chemical structure of a group (or a linking group) Y.

This is considered to result from the phenomenon that the energy level of the valence and conduction bands or the size of the band gap is changed in the polymer according to changes in the spread of the electron cloud (i.e., distribution of electrons) in the main skeleton which contributes to carrier transportation.

In the compound (A1), the group Y contains at least one substituted or unsubstituted aromatic hydrocarbon ring or at least one substituted or unsubstituted heterocyclic ring. By selecting the kinds of the aromatic hydrocarbon ring and/or heterocyclic ring appropriately, it is possible to adjust carrier transport properties in a resultant polymer relatively easily.

For example, by selecting a structure constituted from an unsubstituted aromatic hydrocarbon ring as the group Y, it is possible to obtain a polymer which can exhibit a hole transport ability, and therefore the compound (A1) having such a group Y can be used as the hole transport material.

In more details, as for the structure constituted from the unsubstituted aromatic hydrocarbon ring, those represented by the following chemical formulas (C1) to (C17) can be mentioned.

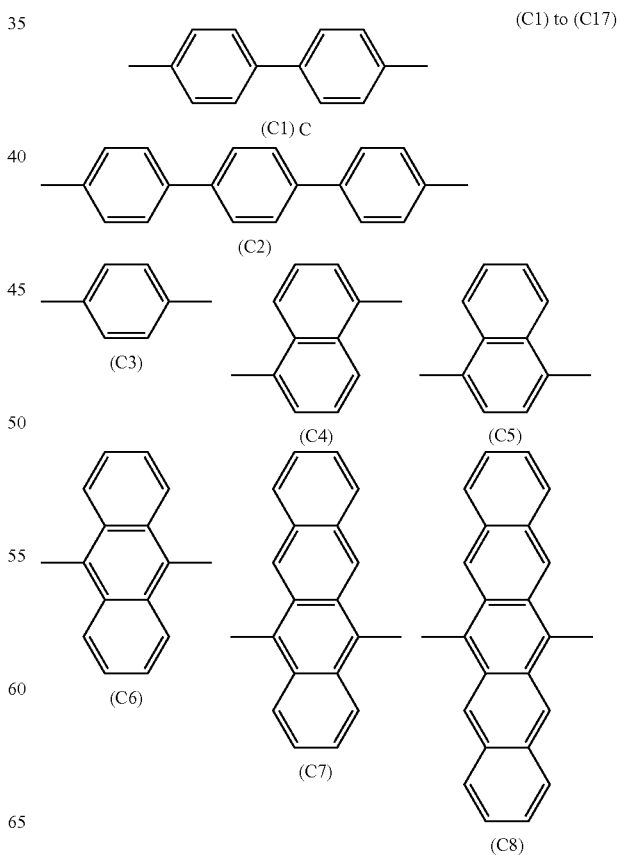

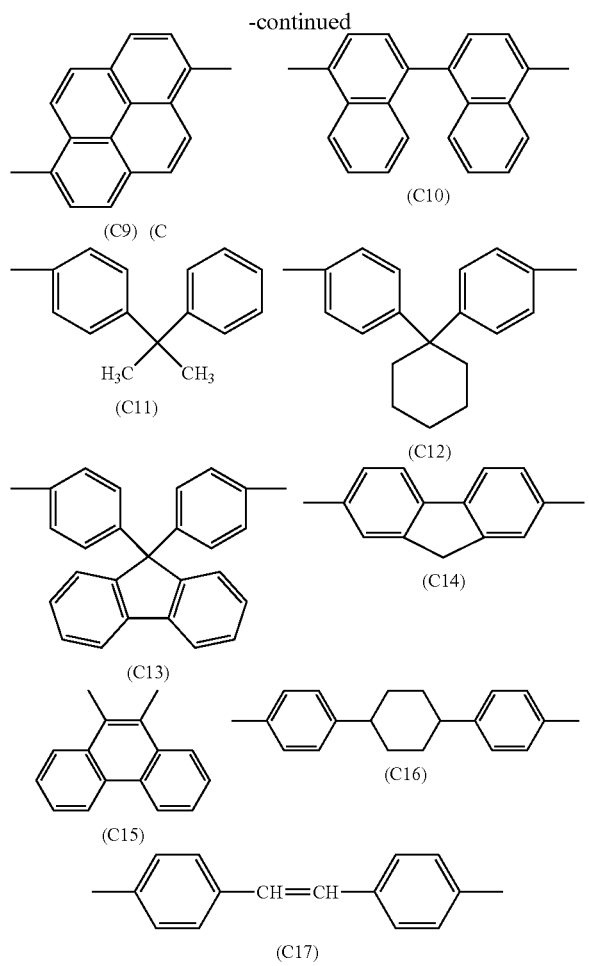

In this case, it is preferred that the group Y has 6 to 30 carbon atoms, more preferably 10 to 25 carbon atoms, and even more preferably 10 to 20, in total.

Further, in the group Y, it is preferred that the number of aromatic hydrocarbon ring is 1 to 5, more preferably 2 to 5, and even more preferably 2 or 3.

Taking the above-mentioned factors into account, in the compound (A1) a biphenylene group represented by the chemical formula (C1) or its derivative is considered to be an especially preferable structure as the group Y.

By selecting such a group, the hole transport ability in the resultant polymer becomes excellent, and thus a semiconductor layer to be formed from the polymer can also have a higher hole transport ability.

Next, by selecting a structure which contains at least one substituted or unsubstituted heterocyclic ring as the group Y, it is possible to control the carrier transport property of the resultant polymer relatively easily.

As for such a heterocyclic ring, it is preferred to select a heterocyclic ring which contains at least one heteroatom selected from among nitrogen, oxygen, sulfur, selenium, and tellurium. By selecting such a heterocyclic ring that contains such a kind of heteroatom, it is particularly easy to change the energy level of the valence and conduction bands or the size of the band gap of the polymer.

The heterocyclic ring may be either an aromatic heterocycle or a nonaromatic heterocycle, but an aromatic heterocycle is preferably used. By using an aromatic heterocycle, it is possible to properly prevent the electron density of the main skeleton with a conjugated chemical structure from being biased, that is, it is possible to properly prevent the localization of π electrons. As a result, the carrier transport ability of the polymer is prevented from being lowered.

The group Y preferably contains 1 to 5 heterocyclic rings, more preferably 1 to 3 heterocyclic rings. In the case where the group Y contains 2 or more heterocyclic rings, these rings are the same or different. By allowing the group Y to have such a number of heterocyclic rings, it is possible to sufficiently change the energy level of the valence and conduction bands or the size of the band gap of the polymer.

The group Y preferably has 2 to 75 carbon atoms, more preferably 2 to 50 carbon atoms, in total. If the group Y has too many carbon atoms in total, the solubility of the compound represented by the general formula (A1) in a solvent tends to be lowered depending on the kind of substituent $X^1$.

By setting a total number of carbon atoms contained in the group Y to a value within the above range, it is possible to maintain the planarity of the main skeleton. As a result, the carrier transport ability of the polymer is reliably prevented from being impaired.

Taking these factors into account, as a structure constituted from unsubstituted heterocyclic rings, such structures as represented by any one of the following chemical formulas (D1) to (D17) are considered to be preferable structures.

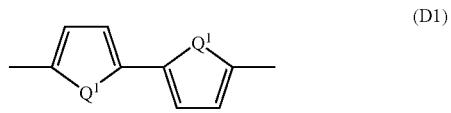

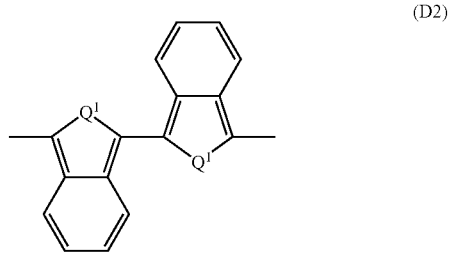

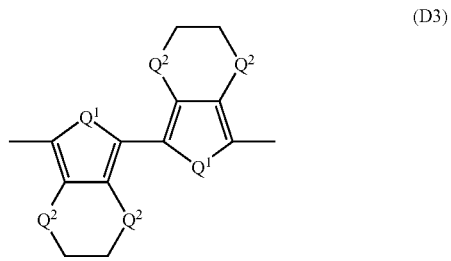

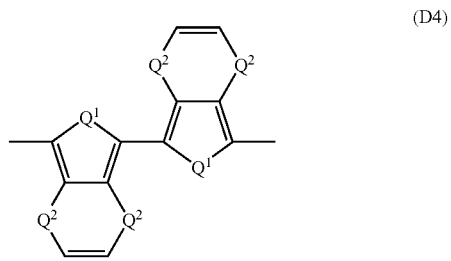

-continued

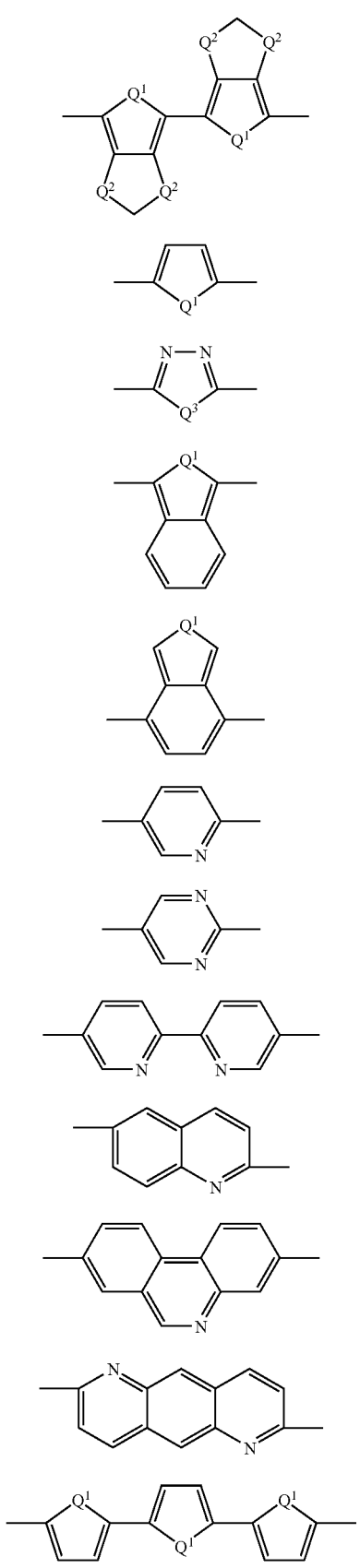

(D5)
(D6)
(D7)
(D8)
(D9)
(D10)
(D11)
(D12)
(D13)
(D14)
(D15)
(D16)

-continued

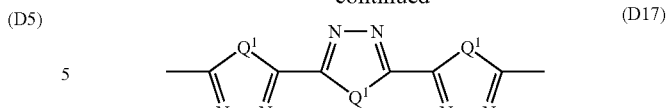

(D17)

wherein in these chemical formulas $Q^1$s are the same or different and each independently represents $N\text{-}T^1$, S, O, Se, or Te (where $T^1$ represents H, $CH_3$, or Ph), $Q^2$s are the same or different and each independently represents S or O, and $Q^3$s are the same or different and each independently represents $N\text{-}T^3$, S, O, Se, or Te (where $T^3$ represents H, $CH_3$, $C_2H_5$ or Ph).

Furthermore, by selecting chemical structures constituted from substituted or unsubstituted aromatic hydrocarbon ring and substituted or unsubstituted heterocyclic ring as the group (bonding group) Y, the synergistic effect resulted from the respective effects described above can be obtained.

In this regard, it is particularly preferred that such a group Y contains aromatic hydrocarbon rings respectively bonded to each of Ns in the compound (A1) and a heterocyclic ring existed between the aromatic hydrocarbon rings. This makes it possible to reliably prevent electron density from being biased in a resultant polymer. As a result, a carrier transport ability of the polymer can be made constant.

Taking these factors into account, as a structure constituted from the unsubstituted aromatic hydrocarbon rings and the heterocyclic ring, such structures as represented by any one of the following chemical formulas (E1) and (E3) are considered to be preferable structures.

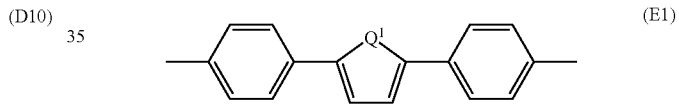

(E1)

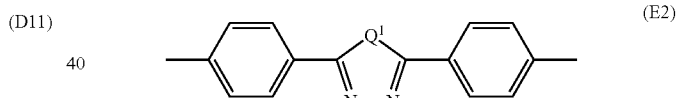

(E2)

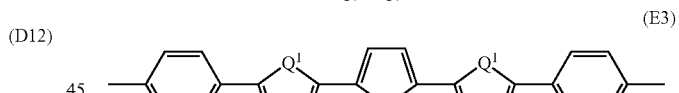

(E3)

wherein in these chemical formulas $Q^1$s are the same or different and each independently represents $N\text{-}T^1$, S, O, Se, or Te (where $T^1$ represents H, $CH_3$, or Ph).

By appropriately determining the chemical structure of the group Y as described above, a polymer obtained by selecting any one of the chemical formulas (D2), (D16), (E1) and (E3) as the group Y can exhibit a high hole transport ability as compared to a polymer obtained by selecting the chemical formula (D17) and can exhibit an especially high hole transport ability as compared to a polymer obtained by selecting the chemical formula (D8) or (E2).

On the contrary, a polymer obtained by selecting any one of the chemical formulas (D8), (D17) and (E2) as the group Y can exhibit a high electron transport ability as compared to a polymer obtained by the chemical formula (D2) or (D16). Further, a polymer obtained by selecting one of the chemical formulas (D8), (D17) and (E2) as the group Y can also exhibit an especially high electron transport ability as compared to a polymer obtained by selecting the chemical formula (E1) or (E3).

For the reasons stated in the above, in the case where a polymer obtained by selecting the structure represented by the chemical formula (D2), (D16), (E1) or (E3) as the group Y is used for the hole transport material, a polymer obtained by selecting the chemical formula (E2), (D8) and (D17) as the group Y can be used for the electron transport layer.

In this regard, it is to be noted that depending on the combination of the hole transport material and the electron transport material, the polymer mentioned above can be used as the light emitting material.

For example, in the case where poly(thiophene/styrenesulfonic acid) such as poly(3,4-ethylenedioxythiophene/styrenesulfonic acid) or an arylamine compound such as N,N'-bis(1-naphthyl)-N,N'-diphenyl-benzidine (α-NPD) is used as a constituent material of the hole transport layer and a triazole-based compound such as 3,4,5-triphenyl-1,2,4-triazole or an oxadiazole compound such as 2-(4-t-butylphenyl)-5-(biphenyl-4-yl)-1,3,5-oxadiazole (PBD) is used as a constituent material of the electron transport layer, a polymer of the compound represented by the general formula (A1) in which the group Y has a chemical structure represented by the chemical formula (D12) or (D14) can be used as a constituent material for forming a light emitting layer.

Further, the unsubstituted heterocyclic ring and/or the unsubstituted aromatic hydrocarbon ring contained in the group Y may introduce a substituent so long as the planarity of the main skeleton is not greatly affected. Examples of such a substituent include an alkyl group having a relatively small number of carbon atoms such as a methyl group or an ethyl group or and a halogen group and the like.

Hereinbelow, a description will be made with regard to a polymer obtained from the compound (A2).

In this regard, it should be noted that the following description will be made by focusing the different points from the polymer obtained from the compound (A1), and explanations for the same or similar points are omitted.

The compound (A2) is the same as the compound (A1) excepting that the compound (A1) has two substituents $X^1$ and two substituents $R^1$ while the compound (A2) has four substituents $X^2$ to $X^5$ and eight substituents $R^3$.

As for each of the substituents $X^2$ to $X^5$, a group having the same structure as that of the substituent $X^1$ is selected. In the compound (A2), since there are four substituents $X^2$ to $X^5$, a two-dimensional network is easily to be formed.

In the compound (A2), it is preferred that the substituent $X^2$ and the substituent $X^4$ are identical with each other. Namely, it is preferred that the substituent $X^2$ and the substituent $X^4$ have substantially the same number of carbon atoms and more preferably exactly the same number of carbon atoms. This makes it possible for the adjacent main skeletons of the compounds which are to be linked by the polymerization reaction at the respective substituents $X^2$ to $X^5$ (that is, the substituent $X^2$ or the substituent $X^4$) to make variation in their intervals small. Namely, it is possible to make variation in the intervals between the main skeletons small in a resultant polymer. As a result, it is possible to prevent the electron density from being biased in the resultant polymer effectively, thereby enabling a hole transport ability of the polymer to be improved.

In view of the above, it is also preferred that the substituent $X^3$ and the substituent $X^5$ are identical with each other. Namely, it is also preferred that the substituent $X^3$ and the substituent $X^5$ have substantially the same number of carbon atoms and more preferably exactly the same number of carbon atoms. This makes it possible to improve the above-described effect further, thereby enabling the carrier transport ability of the polymer to be further improved.

Further, it is also preferred that the substituent $X^2$, the substituent $X^3$, the substituent $X^4$ and the substituent $X^5$ are identical with each other. Namely, it is also preferred that the substituent $X^2$, the substituent $X^3$, the substituent $X^4$ and the substituent $X^5$ have, substantially the same number of carbon atoms and more preferably exactly the same number of carbon atoms. This makes it possible to exhibit the above-described effect conspicuously. Further, in this case, since the length of each of the substituents $X^2$ to $X^5$ which protrudes from the main skeleton is substantially the same (or exactly the same) with each other, it is possible to decrease a possibility that steric hindrance is caused by the substituents $X^2$ to $X^5$. This makes it possible that polymerization reaction is carried out reliably between the substituents $X^2$ to $X^5$, that is the polymer is produced reliably. With this result, it is possible to further improve the carrier transport ability of the polymer.

The substituent $R^3$ is a hydrogen atom, a methyl group, or a ethyl, group, and the substituent $R^3$ can be selected according to the number of carbon atoms of the substituents $X^2$ to $X^5$. For example, in the case where the number of carbon atoms of the substituents $X^2$ to $X^5$ is large, a hydrogen atom is selected as the substituent $R^3$, while in the case where the number of carbon atoms of the substituent $R^3$ is small, a methyl group or an ethyl group is selected as the substituent $R^3$.

In the meantime, as the substituent $X^1$ and the substituents $X^2$ to $X^5$ (Hereinbelow, these substituents will be correctively referred to as "substituents X"), a chemical structure represented by the following general formula (B4) may be selected instead of the chemical structures represented by the general formulas (B1) to (B3). In this case, in order to obtain a polymer by polymerization reaction at the substituents X, polycondensation reaction can be made in a state that phosgene represented by the chemical formula $COCl_2$ and/or its derivative is mediated between the substituents X to form a chemical structure represented by the following general formula (B5):

(B4)

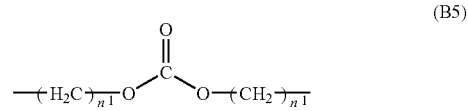

(B5)

wherein each $n^1$ in these formulas independently represents an integer of 2 to 8, and these $n^1$s are the same or different.

Such a polymer has a structure in which the main skeletons are repeatedly existed through the chemical structure represented by the general formula (B5), that is a chemical structure in which two straight-chain carbon to carbon bonds (alkylene groups) are linked through a carbonate linkage. Because of the existence of such a chemical structure, in the same manner as the case where each of the chemical structures represented by the general formulas (B1) to (B3) is used, it is possible to allow the main skeletons to exist at a predetermined interval, thereby enabling interaction between the adjacent main skeletons to be decreased.

There is no specific limitation on the kind of phosgene and/or its derivative to be used if it is possible to form the chemical structure represented by the above-mentioned general formula (B5) by polycondensation reaction with the hydrokyl group at the end of each of the substituents X, but phosgene and/or its derivative which is mainly comprised of the compound represented by the following general formula (B6) are preferably used.

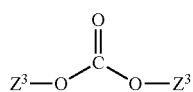

where two $Z^3$s are the same or different, and each independently represents an alkyl group, a phenyl group, or a benzyl group each having 1 to 6 carbon atoms.

When the substituents $X^1$ are allowed to make polycondensation reaction with phosgene and/or its derivative, a by-product material is produced. By using phosgene and/or, the above-mentioned compound (B6) in the polycondensation reaction, it is possible to eliminate such a by-product material from a semiconductor layer to be formed relatively easily. In this way, it is possible to prevent carriers from being captured by the by-product material in the semiconductor layer to be formed. As a result, it is possible to prevent appropriately a carrier transport ability of the semiconductor layer from being decreased.

Now, a curing agent may be added to a polymer obtained from the compound (A1) or the compound (A2) as described above. Namely, polymerization reaction of the substituents X of the compound (A1) or the compound (A2) may be carried out via the curing agent.

Examples of such a curing agent include acryl-based curing agents, vinyl compounds such as divinylbenzene, epoxy-based curing agents, and polyamine-based curing agents, and the like.

In this connection, in the case where the chemical structure represented by any one of the above-mentioned general formulas (B1) to (B3) is selected as the substituent X, it is particularly effective to make the polymerization reaction of the substituents X via the curing agent. This makes it possible to effectively prevent the interval between the main skeletons from becoming too small even in the case where a substituent having a relatively small number of carbon atoms, that is a substituent having a relatively short chain length is selected as the substituent X. As a result, since the interval between the main skeletons is maintained at a proper distance, it is possible to prevent reliably the interaction between the main skeletons from being increased.

In the case where the chemical structure represented by the above-mentioned general formula (B1) is selected as the substituent X, it is preferable to use at least one acryl-based curing agent selected from the group comprising a polyester (meth)acrylate curing agent, and epoxy(meth)acrylate curing agent, and a polyurethane(meth)acrylate curing agent and the like.

Examples of the polyester(meth)acrylate curing agent include the compounds represented by the following chemical formulas (F1) to (F3).

Examples of the epoxy(meth)acrylate curing agent include the compounds represented by the following chemical formulas (F4) to (F8).

Examples of the polyurethane(meth)acrylate curing agent include the compound represented by the following chemical formula (F9).

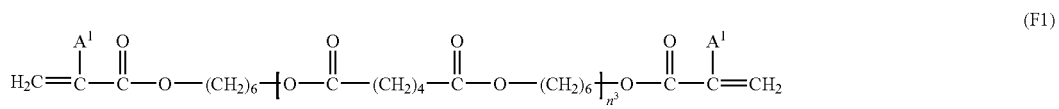

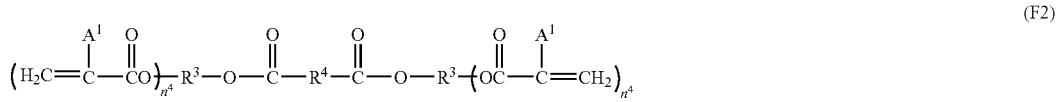

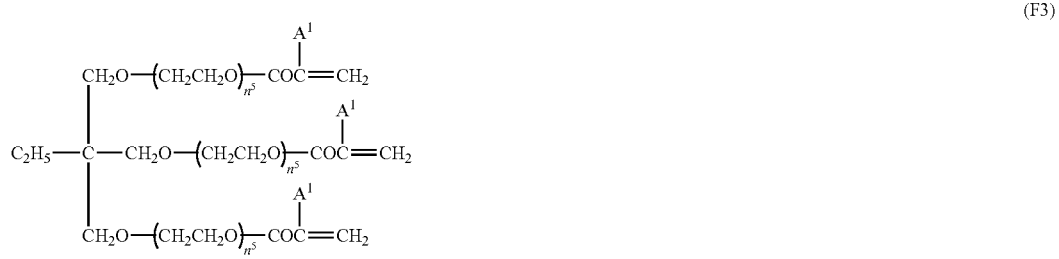

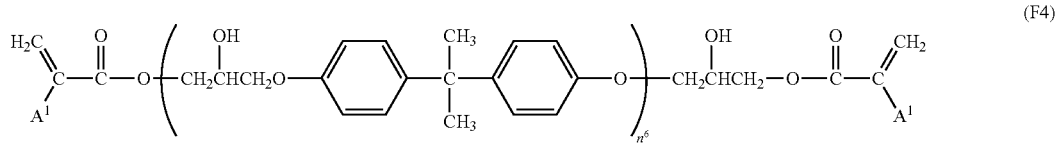

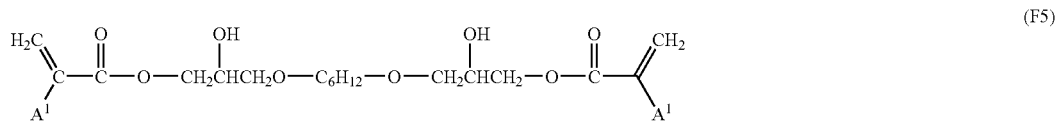

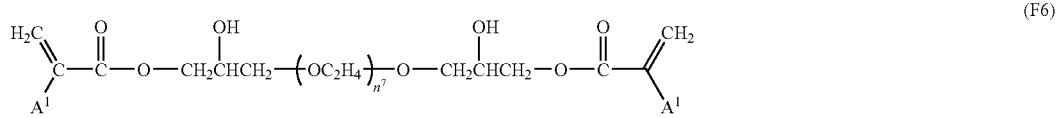

-continued

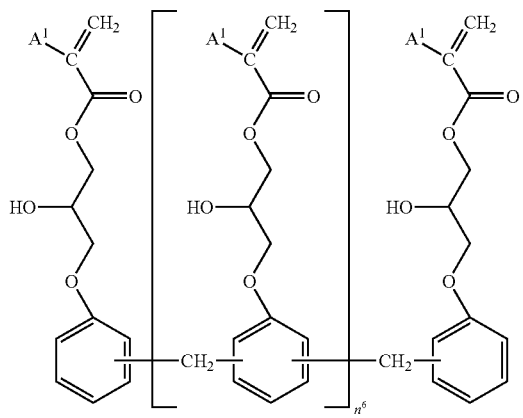 (F7)

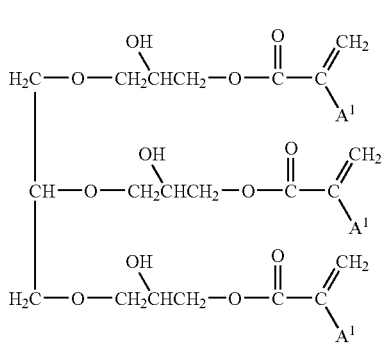 (F8)

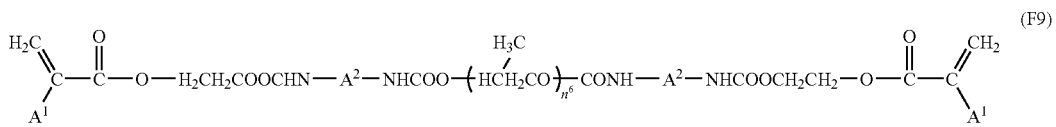 (F9)

Note that in these general formulas, $n^3$ is an integer equal to or smaller than 4,500, $n^4$ is an integer of 1 to 3, and $n^5$ is an integer of 0 to 1500. $n^6$s are the same or different, and each independently represents an integer of 1 to 10. $n^7$ is an integer of 1 to 40, and $n^8$ is an integer of 1 to 100. $R^3$s are the same or different, and each independently represents an alkylene group having carbon atoms of 1 to 10, and $R^4$ represents an alkylene group having carbon atoms of 1 to 100. $A^1$s are the same or different, and each independently represents a hydrogen atom or a methyl group. $A^2$s are the same or different, and each independently represents a group obtained by removing two isocyanate groups from a diisocyanate compound.

Further, in the case where the chemical structure represented by the general formula (B2) is selected, it is preferable to use at least one of the following epoxy-based curing agents or polyamine-based curing agents as the curing agent. Namely, examples of such epoxy-based curing agents include a (meth)acrylic ester-based epoxy cross-linking agent, a bisphenol epoxy cross-linking agent, a glycidyl ester-based epoxy cross-linking agent, an alicyclic epoxy cross-linking agent, an urethane modified epoxy cross-linking agent, a silicon-containing epoxy cross-linking agent, a polyfunctional phenol-based epoxy cross-linking agent, and the like. Examples of such polyamine-based curing agents include an aliphatic polyamine-based curing agent, an alicyclic polyamine-based curing agent, and the like.

As for such a (meth)acrylic ester-based epoxy cross-linking agent, the compound represented by the following general formula (G1) can be mentioned.

As for a bisphenol epoxy cross-linking agent, the compounds represented by the following general formulas (G2) to (G6) can be mentioned.

As for such a glycidyl ester-based epoxy cross-linking agent, the compounds represented by the following general formulas (G7) and (G8) can be mentioned.

As for such an alicyclic epoxy cross-linking agent, the compounds represented by the following general formulas (G9) to (G12) can be mentioned.

As for such an urethane modified epoxy cross-linking agent, a silicon-containing epoxy cross-linking agent, the compound represented by the following general formula (G13) can be mentioned.

As for such a silicon-containing epoxy cross-linking agent, the compound represented by the following general formula (G14) can be mentioned.

As for such a polyfunctional phenol-based epoxy cross-linking agent, the compounds represented by the following general formulas (G15) to (G22) can be mentioned.

As for such a glycidyl amine-based epoxy cross-linking agent, the compounds represented by the following general formulas (G23) to (G25) can be mentioned.

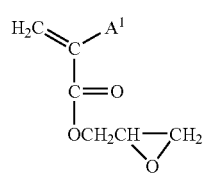
(G1)
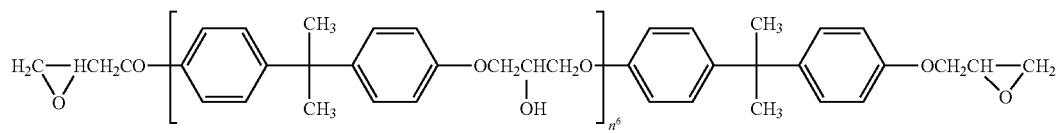
(G2)
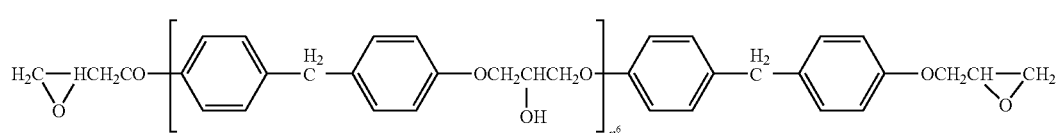
(G3)
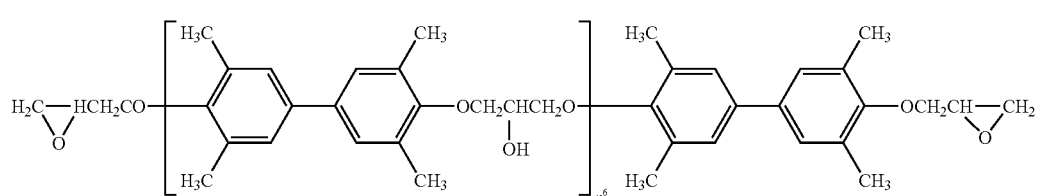
(G4)
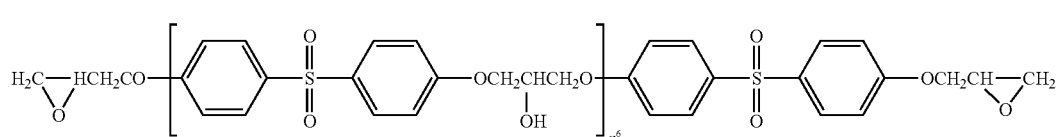
(G5)
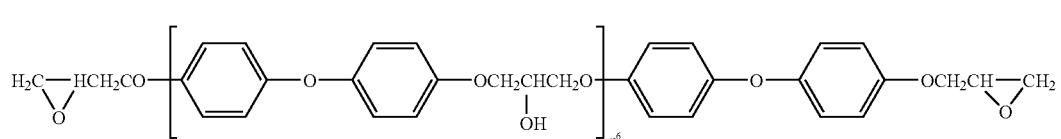
(G6)
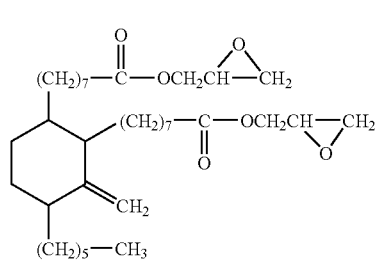
(G7)
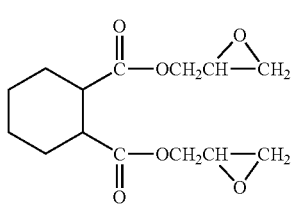
(G8)
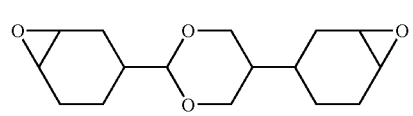
(G9)
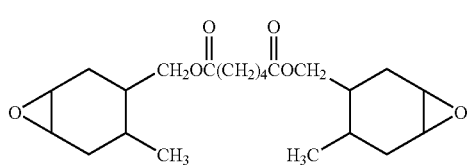
(G10)
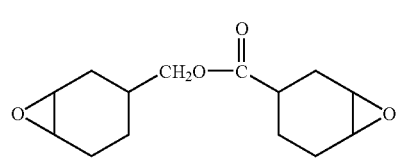
(G11)
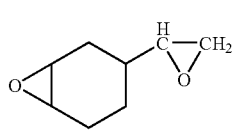
(G12)
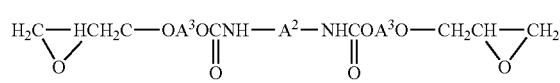
(G13)

-continued
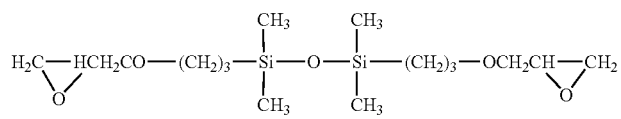
(G14)
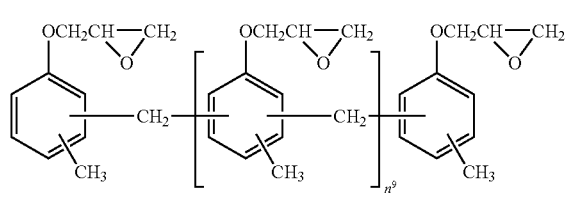
(G15)
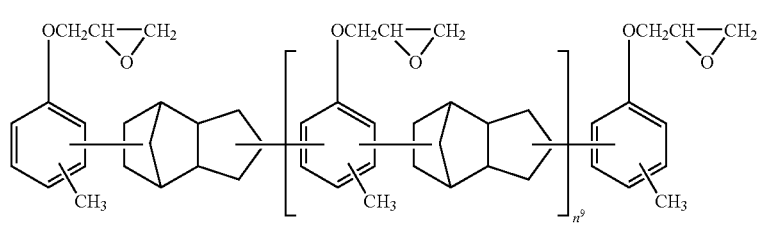
(G16)
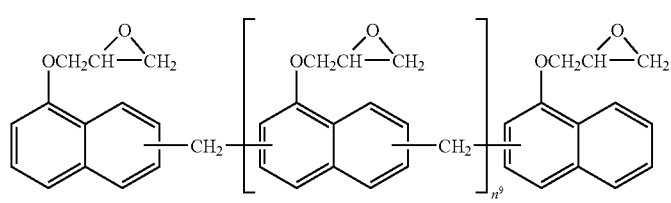
(G17)
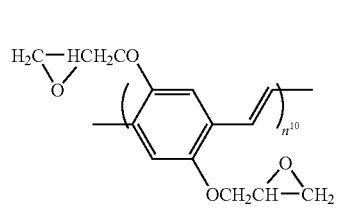
(G18)
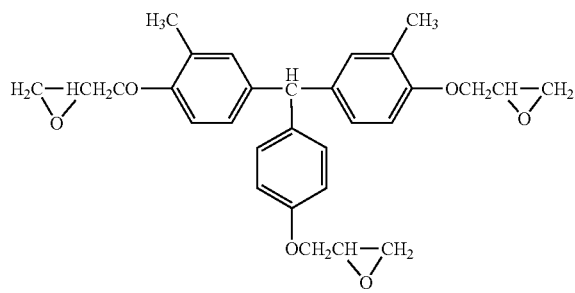
(G19)
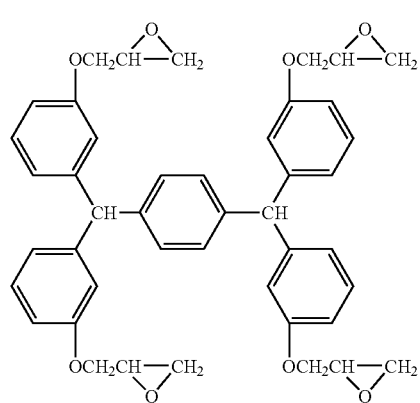
(G20)
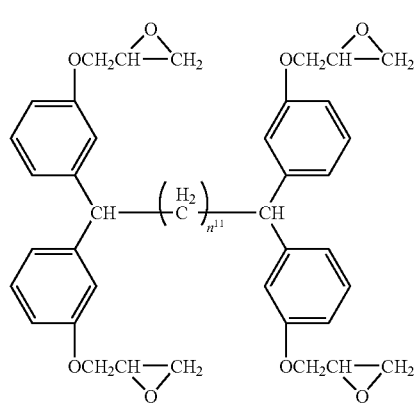
(G21)

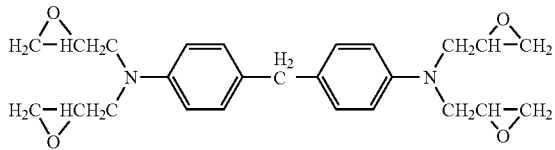
(G22)

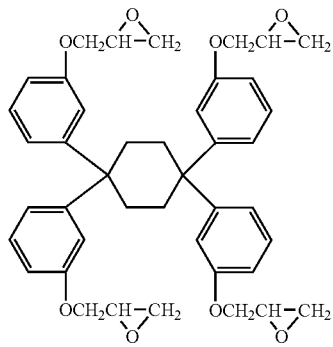

(G23)

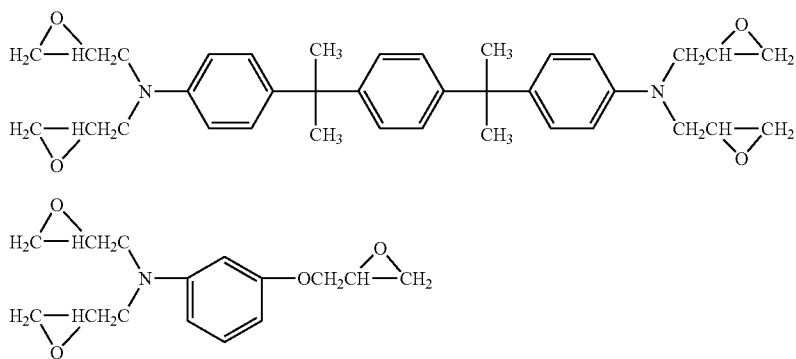

(G24)

(G25)

Note that in these general formulas, $A^1$ represents a hydrogen atom or a methyl group. $n^6$s are the same or different, and each independently represents an integer of 0 to 10, and $n^9$s are the same or different, and each independently represents an integer of 1 to 20. $n^{10}$ represents an integer of 1 to 30, and $n^{11}$ is an integer of 0 to 8. $R^3$s are the same or different, and each independently represents an alkylene group having carbon atoms of 1 to 10, and $R^4$ represents an alkylene group having carbon atoms of 1 to 100. $A^2$ represents a group obtained by removing two isocyanate groups from a diisocyanate compound, and $A^3$s are the same or different, and each independently represents a group obtained by removing two isocyanate groups from a diisocyanate compound.

Further, examples of the aliphatic polyamine-based curing agents include diethylenetriamine, triethylenetetramine, tetraethylenepentamine, hexamethylenediamine, and diethylaminopropylamine, and the like.

Furthermore, examples of the alicyclic polyamine-based curing agents include isophoronediamine, norbornenediamine, and menthane diamine, and the like.

In the case where the chemical structure represented by the above-mentioned general formula (B3) is selected as the substituent X, it is preferable to use at least one vinyl compound such as polyethyleneglycoldi(meth)acrylate which is represented by the hollowing general formulas (H1) and divinylbenzene.

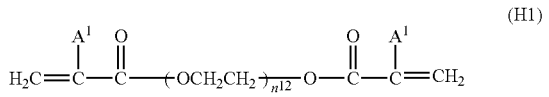
(H1)

wherein $n^{12}$ represents an integer of 5 to 15, and $A^1$s are the same or different, and each independently represents a hydrogen atom or a methyl group.

(Electronic device)

Hereinbelow, a description will be made based on one example where the electronic device according to the present invention is applied to a display device.

Figure 3:
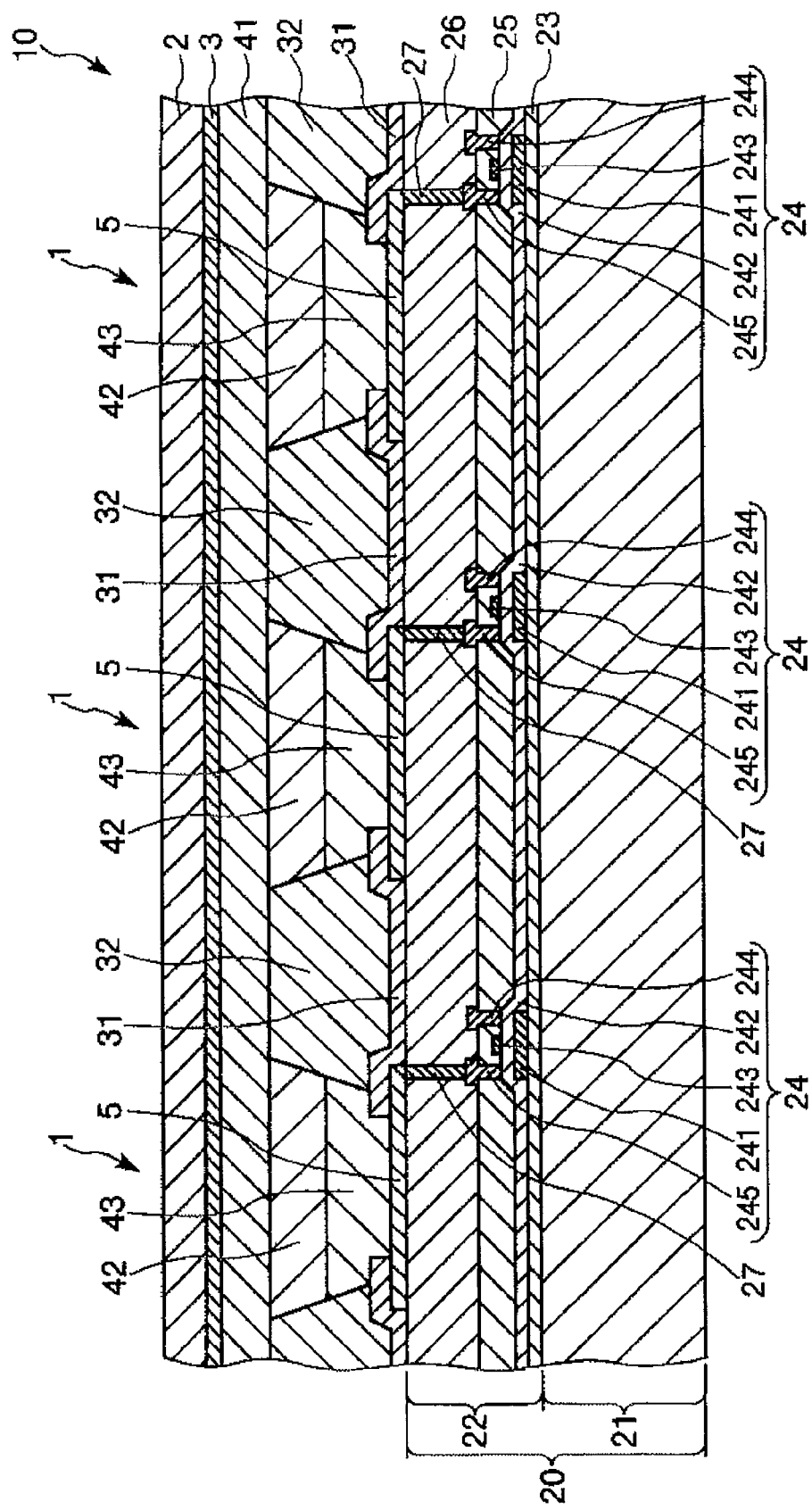
FIG. 3 is a cross-sectional view of an embodiment of an electronic device according to the present invention, which is directed to a case where the semiconductor element is applied to a display device.

FIG. 3 is a cross-sectional view of an embodiment of an electronic device according to the present invention, which is directed to a case where the electronic device is applied to a display device.

As shown in FIG. 3, a display device 10 includes a base 20 and a plurality of organic EL elements provided on the base 20.

The base 20 includes a substrate 21 and a circuit section 22 formed on the substrate 21. The circuit section 22 includes a protective layer 23 provided on the substrate 21 and formed from a titanium oxide layer, a driving TFT (switching element) 24 formed on the protective layer 23, a first insulation layer 24, and a second insulation layer 26.

The driving TFT 24 includes a semiconductor layer 241 made of a silicon, a gate insulation layer 242 formed on the semiconductor layer 241, a gate electrode 243 formed on the gate insulation layer 242, a source electrode 244, and a drain electrode 245.

The organic EL elements 1 are provided on the circuit section 22 having the above structure so as to be associated with the respective driving TFTs 24. Further, the adjacent organic EL elements 1 are partitioned by the first partitioning wall portion 31 and a second partitioning wall portion 32.

In this embodiment, a cathode 5 of each organic EL element 1 constitutes a pixel electrode, and it is electrically connected to the drain electrode 245 of the corresponding driving TFT 24 through the wiring 27.

Further, in the respective organic EL elements 1, the anode 3 and the hole transport layer 41 are not divided and they are integrally formed, respectively, wherein the hole transport layer 41 is formed by integrating or uniting the two layers together.

Furthermore, a seal member (not shown in the drawing) is joined to the base 20 so as to cover the respective organic EL elements 1 to thereby seal the organic EL elements 1.

The display device 10 may be formed into a single color display type, but the display device 10 can display a color image by selecting light emitting materials used for the respective organic EL elements 1.

(Electronic Equipment)

The display device 10 described above (that is, an electronic device according to the present invention) can be used for various electronic equipment.

Figure 4:
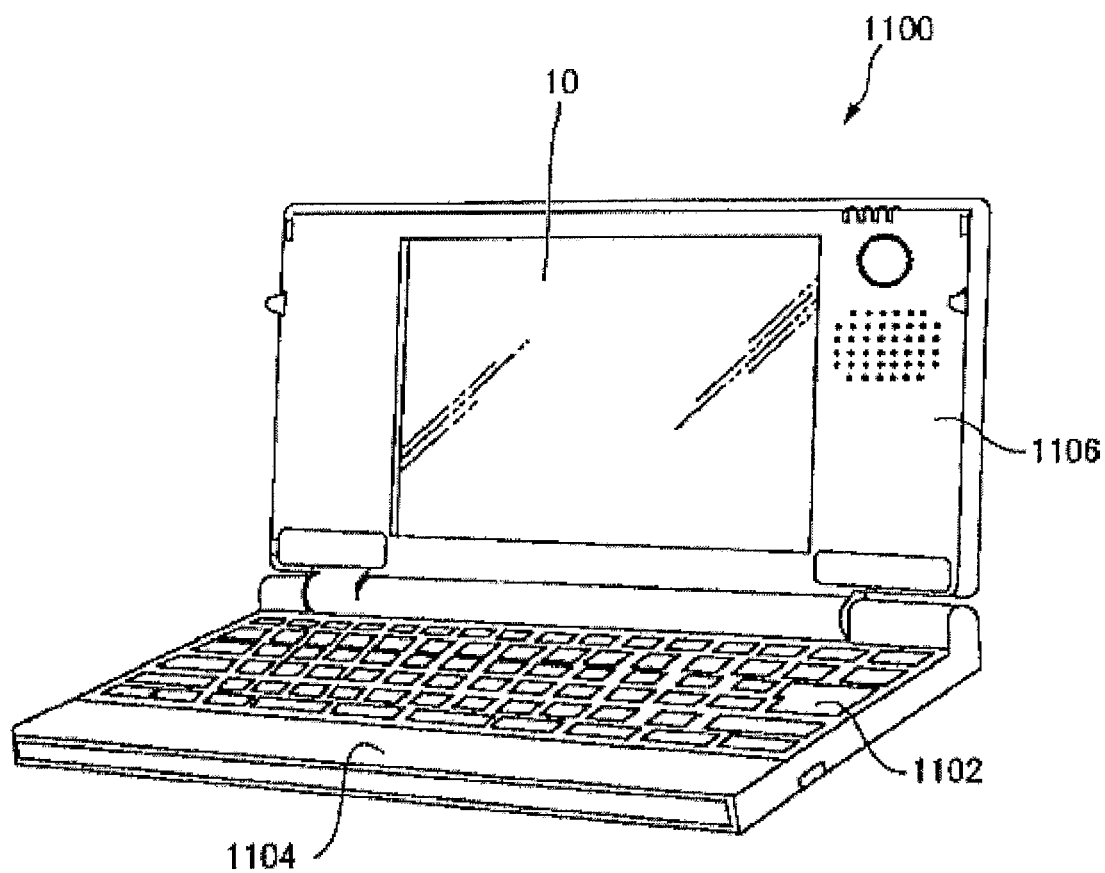
FIG. 4 is a perspective view which shows the structure of a personal mobile computer (or a personal notebook computer) which one example of the electronic equipment according to the present invention.

FIG. 4 is a perspective view which shows the structure of a personal mobile computer (or a personal notebook computer) which is one example of the electronic equipment provided with the electronic device according to the present invention.

In FIG. 4, a personal computer 1100 is comprised of a main body 1104 provided with a keyboard 1102 and a display unit 1106 provided with a display unit having a display (screen). The display unit 1106 is rotatably supported by the main body 1104 via a hinge structure.

In the personal computer 1100, the display (screen) of the display unit 1106 is constructed from the display device 10 described above.

Figure 5:
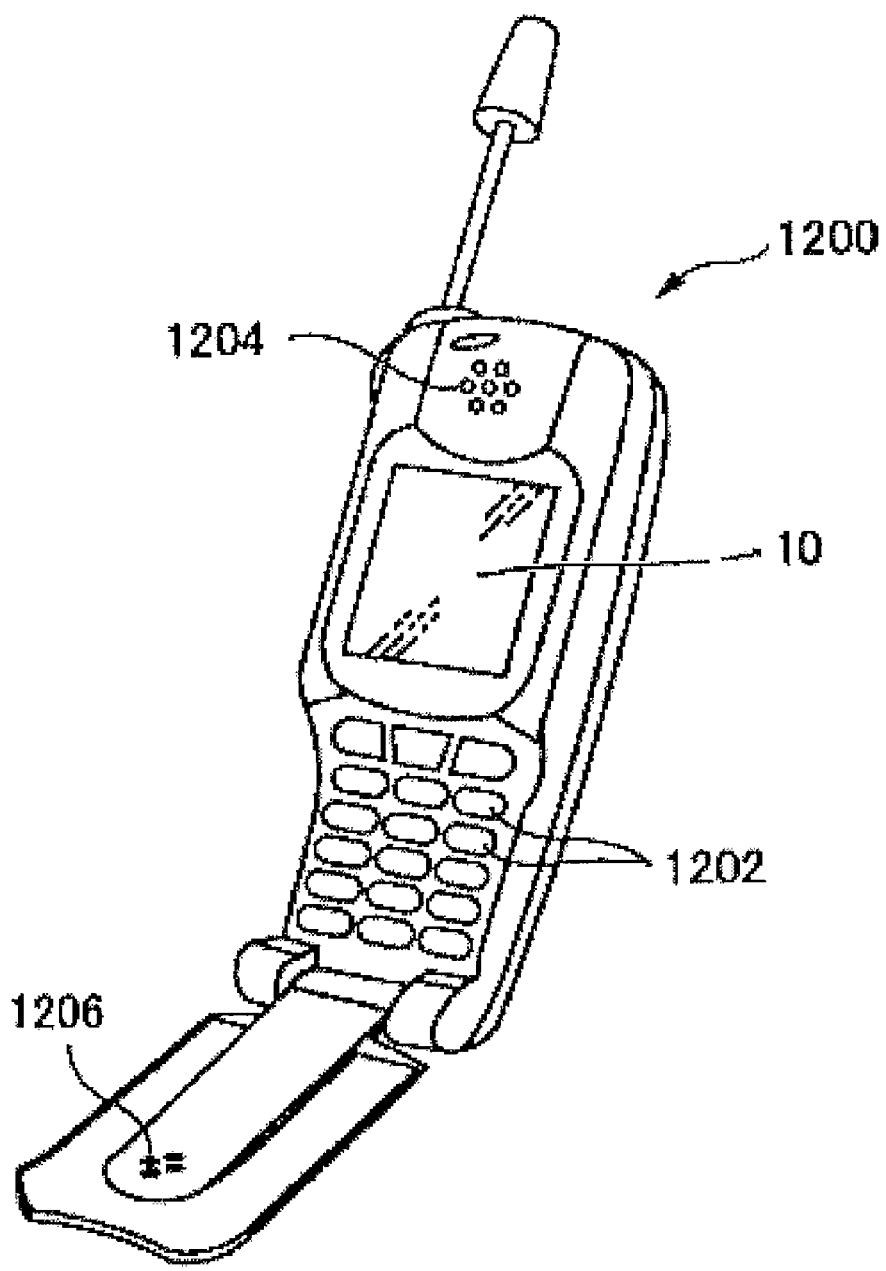
FIG. 5 is a perspective view which shows the structure of a mobile phone (including the personal handyphone system (PHS)) which is the other example of the electronic equipment according to the present invention.

FIG. 5 is a perspective view which shows the structure of a mobile phone (including the personal handyphone system (PHS)) which is the other example of the electronic equipment according to the present invention.

The mobile phone 1200 shown in FIG. 5 includes a plurality of operation buttons 1202, an earpiece 1204, a mouthpiece 1206, and a display.

In this mobile phone 1200, the display is constructed from the display device 10 as described above.

Figure 6:
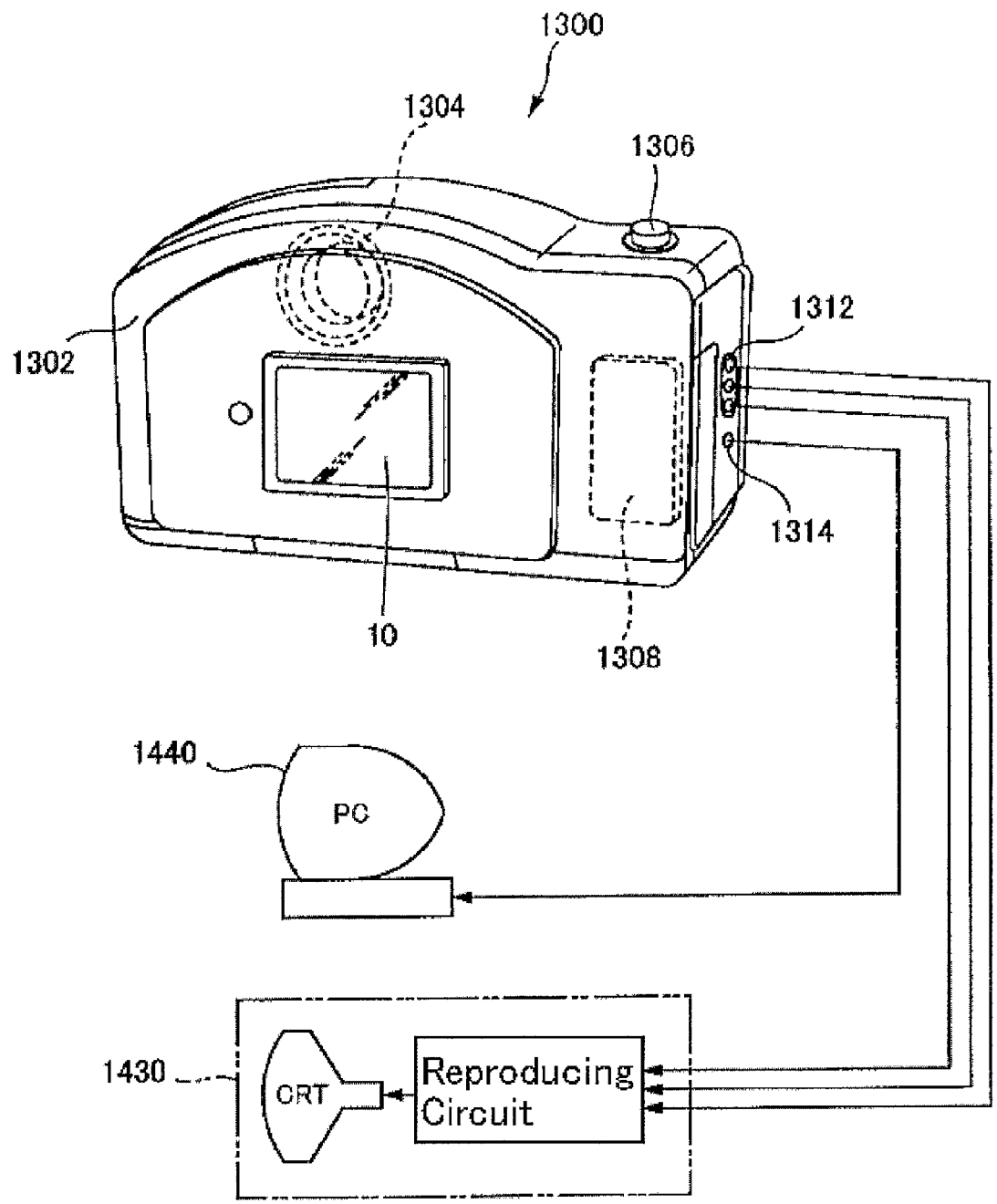
FIG. 6 is a perspective view which shows the structure of a digital still camera which is still other example of the electronic equipment according to the present invention.

FIG. 6 is a perspective view which shows the structure of a digital still camera which is still other example of the electronic equipment according to the present invention. In this drawing, interfacing to external devices is simply illustrated.

In a conventional camera, a silver salt film is exposed to the optical image of an object. On the other hand, in the digital still camera 1300, an image pickup device such as a CCD (Charge Coupled Device) generates an image pickup signal (or an image signal) by photoelectric conversion of the optical image of an object.

In the rear surface of a case (or a body) 1302 of the digital still camera 1300, there is provided a display which provides an image based on the image pickup signal generated by the CCD. That is, the display functions as a finder which displays the object as an electronic image.

In this digital still camera 1300, the display is constructed from the display device 10 as described above.

In the inside of the case, there is provided a circuit board 1308. The circuit board 1308 has a memory capable of storing an image pickup signal.

In the front surface of the case 1302 (in FIG. 6, the front surface of the case 1302 is on the back side), there is provided a light receiving unit 1304 including an optical lens (an image pickup optical system) and a CCD.

When a photographer presses a shutter button 1306 after checking an object image on the display, an image pickup signal generated by the CCD at that time is transferred to the memory in the circuit board 1308 and then stored therein.

Further, in the side surface of the case 1302 of the digital still camera 1300, there are provided a video signal output terminal 1312 and an input-output terminal for data communication 1314. As shown in FIG. 6, when necessary, a television monitor 1430 and a personal computer 1440 are connected to the video signal output terminal 1312 and the input-output terminal for data communication 1314, respectively. In this case, an image pickup signal stored in the memory of the circuit board 1308 is outputted to the television monitor 1430 or the personal computer 1440 by carrying out predetermined operations.

The electronic equipment according to the present invention can be applied not only to the personal computer (which is a personal mobile computer) shown in FIG. 4, the mobile phone shown in FIG. 5, and the digital still camera shown in FIG. 6 but also to a television set, a video camera, a view-finer or monitor type of video tape recorder, a laptop-type personal computer, a car navigation device, a pager, an electronic notepad (which may have communication facility), an electronic dictionary, an electronic calculator, a computerized game machine, a word processor, a workstation, a videophone, a security television monitor, an electronic binocular, a POS terminal, an apparatus provided with a touch panel (e.g., a cash dispenser located on a financial institute, a ticket vending machine), medical equipment (e.g., an electronic thermometer, a sphygmomanometer, a blood glucose meter, an electrocardiograph monitor, ultrasonic diagnostic equipment, an endoscope monitor), a fish detector, various measuring instruments, gages (e.g., gages for vehicles, aircraft, and boats and ships), a flight simulator, various monitors, and a projection display such as a projector.

The semiconductor element manufacturing method, the semiconductor element, the electronic device, and the electronic equipment according to the present invention have been described based on the embodiments shown in the drawings, but the present invention is not limited thereto.

For example, the semiconductor element according to the present invention may be applied to a photoelectric conversion element and a thin film transistor in addition to the organic EL device (element).

EXAMPLES

Next, the present invention will be described with reference to actual examples.

1. Synthesis of Compound

First, compounds (A) to (H) described below were prepared.

<Compound (A)>

6-(p-aminophenyl)hexanol was treated with 4-methoxybenzylbromide and sodium hydride in anhydrous dimethylformamide to transform hydroxyl groups into benzyl ether groups and then it was protected.

Next, 1 mol of the obtained compound was dissolved in 150 mL of acetic acid, and acetic anhydride was dropped therein at room temperature and then they were stirred. After the completion of the reaction, a solid matter precipitated was filtered and then dried after washing with water to obtain a dry substance.

Next, 0.37 mol of the thus obtained substance, 0.66 mol of 1-bromo-4-hexylbenzene, 1.1 mol of potassium carbonate, copper powder, and iodine were mixed, and the mixture was heated at a temperature of 200° C. After the heated mixture was cooled down, 130 mL of isoamyl alcohol, 50 mL of pure water and 0.73 mol of potassium hydroxide were added to the mixture, and it was stirred and then dried to thereby obtain a compound.

Next, 130 mmol of the thus obtained compound, 62 mmol of 4,4'-diiodobiphenyl, 1.3 mmol of palladium acetate, 5.2 mmol of t-butylphosphine, 260 mmol of sodium t-butoxide, and 700 mL of xylene were mixed, and then they were stirred at a temperature of 120° C. Thereafter, the mixture was cooled for crystallization.

The thus obtained compound was then reduced by hydrogen gas using Pd—C catalyst so that transformation was made from the benzyl ether groups to the hydroxyl groups to carry out deprotection.

Next, 100 mmol of the compound and 2000 mmol of epichlorohydrin were added to 50% of sodium hydroxide solution to which a small amount of a hydrogen sulphate of tetra-n-butylammonium (phase transfer catalyst) had been added, and then they were stirred for 10 hours at room temperature. Thereafter, the mixture was cooled for crystallization to obtain a compound.

Then, the thus obtained compound was confirmed to be the following compound (A) by means of a mass spectrum (MS) method, a $^1$H-nuclear magnetic resonance ($^1$H-NMR) spectrum method, a $^{13}$C-nuclear magnetic resonance ($^{13}$C-NMR) spectrum method, and a Fourier transform infrared absorption (FT-IR) spectrum method.

<Compound (B)>

6-(p-aminophenyl)hexanol was treated with 4-methoxybenzylbromide and sodium hydride in anhydrous dimethylformamide to transform hydroxyl groups into benzyl ether groups and then it was protected.

Next, 1 mol of the obtained compound was dissolved in 150 mL of acetic acid, and acetic anhydride was dropped therein at room temperature and then they were stirred. After the completion of the reaction, a solid matter precipitated was filtered and then dried after washing with water.

Next, 6-(p-bromophenyl)hexanol was subjected to the same treatment as that for 6-(p-aminophenyl)hexanol to transform hydroxyl groups into benzyl ether groups and then it was protected to obtain a dry substance (benzyl ether derivative).

Next, 0.37 mol of benzyl ether derivative obtained from 6-(p-aminophenyl)hexanol, 0.66 mol of benzyl ether derivative obtained from 6-(p-bromophenyl)hexanol, 1.1 mol of potassium carbonate, copper powder, and iodine were mixed and heated at a temperature of 200° C. After the mixture was cooled down, 130 mL of isoamyl alcohol, 50 mL of pure water, and 0.73 mol of potassium hydroxide were added to the mixture, and then they were stirred and dried.

Further, 130 mmol of the thus obtained compound, 62 mmol of 4,4'-diiodobiphenyl, 1.3 mmol of palladium acetate, 5.2 mmol of t-butylphosphine, 260 mmol of sodium t-butoxide, and 700 mL of xylene were mixed, and then they were stirred at a temperature of 120° C. Thereafter, the mixture was cooled for crystallization.

The thus obtained compound was reduced by hydrogen gas using a Pd—C catalyst so that transformation was made from the benzyl ether groups to the hydroxyl groups to carry out deprotection.

Next, 100 mmol of the thus obtained compound and 2000 mmol of epicholorohydrin were added to a 50% of sodium hydroxide solution to which a small amount of tetra-n-butylammonium hydrogen sulphate (phase transfer catalyst) had been added, and then they were stirred for 10 hours at room temperature. Thereafter, the mixture was cooled for crystallization to obtain a compound.

Then, the thus obtained compound was confirmed to be the following compound (B) by means of the MS method, the $^1$H-NMR method, the $^{13}$C-NMR method, and the FT-IR method.

<Compound (C)>

A compound (C) was obtained in the same manner as the compound (B) except that 4,4'-diiodobiphenyl was changed to 2,5-bis(4-iodophenyl)-thiophene.

<Compound (D)>

A compound (D) was obtained in the same manner as the compound (B) except that 4,4'-diiodobiphenyl was changed to 3,5-diiodo-1,2,4-triazole.

<Compound (E)>

1 mol of 4-hexyl aniline was dissolved in 150 mL of acetic acid, and acetic anhydride was dropped therein at room temperature and then they were stirred. After the completion of the reaction, a solid matter precipitated was filtered and then dried after washing with water to obtain a dry substance.

Next, 0.37 mol of the thus obtained substance, 0.66 mol of 1-bromo-4-hexylbenzene, 1.1 mol of potassium carbonate, copper powder, and iodine were mixed, and the mixture was heated at a temperature of 200° C. After the heated mixture was cooled down, 130 mL of isoamyl alcohol, 50 mL of pure water and 0.73 mol of potassium hydroxide were added to the mixture, and it was stirred and then dried to thereby obtain a compound.

Next, 130 mmol of the thus obtained compound, 62 mmol of 4,4'-diiodobiphenyl, 1.3 mmol of palladium acetate, 5.2 mmol of t-butylphosphine, 260 mmol of sodium t-butoxide, and 700 mL of xylene were mixed, and then they were stirred at a temperature of 120° C. Thereafter, the mixture was cooled for crystallization.

Then, the thus obtained compound was confirmed to be the following compound (E) by means of the MS method, the $^1$H-NMR method, the $^{13}$C-NMR method, and the FT-IR method.

<Compound (F)>

As the following compound (F), N,N,N',N'-tetrakis(4-methylphenyl)-benzidine ("OSA 6140" produced by TOSCO CO., LTD.) was prepared.

<Compound (G)>

1 mol of 1-amino-4-methylbenzene was dissolved in 150 mL of acetic acid, and acetic anhydride was dropped therein at room temperature and then they were stirred. After the completion of the reaction, a solid matter precipitated was filtered and then dried after washing with water to obtain a dry substance.

Next, 0.37 mol of the thus obtained substance, 0.66 mol of 1-bromo-4-methylbenzene, 1.1 mol of potassium carbonate, copper powder, and iodine were mixed, and the mixture was heated at a temperature of 200° C. After the heated mixture was cooled down, 130 mL of isoamyl alcohol, 50 mL of pure water and 0.73 mol of potassium hydroxide were added to the mixture, and it was stirred and then dried to thereby obtain a compound.

Next, 130 mmol of the thus obtained compound, 62 mmol of 3,5-diiodo-1,2,4-triazole, 1.3 mmol of palladium acetate, 5.2 mmol of t-butylphosphine, 260 mmol of sodium t-butoxide, and 700 mL of xylene were mixed, and then they were stirred at a temperature of 120° C. Thereafter, the mixture was cooled for crystallization.

Then, the thus obtained compound was confirmed to be the following compound (G) by means of the MS method, the $^1$H-NMR method, the $^{13}$C-NMR method, and the FT-IR method.

<Compound (H)>

As the compound (H), poly(9,9-dioctyl-2,7-divinylenefluorenyl-ortho-co(anthracene-9,10-diyl) ("OPA 1871" produced by TOSCO CO., LTD.) was prepared.

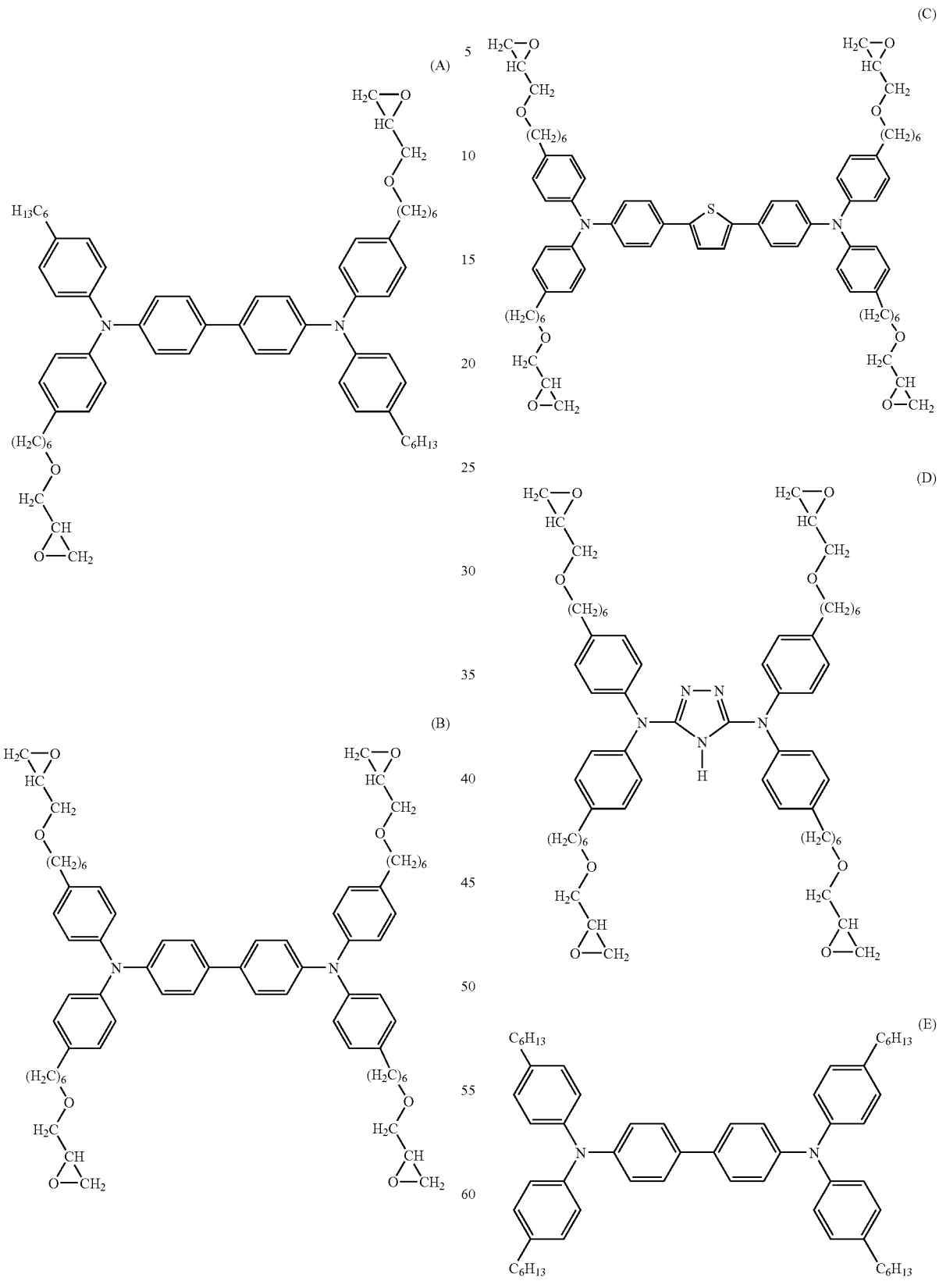

-continued

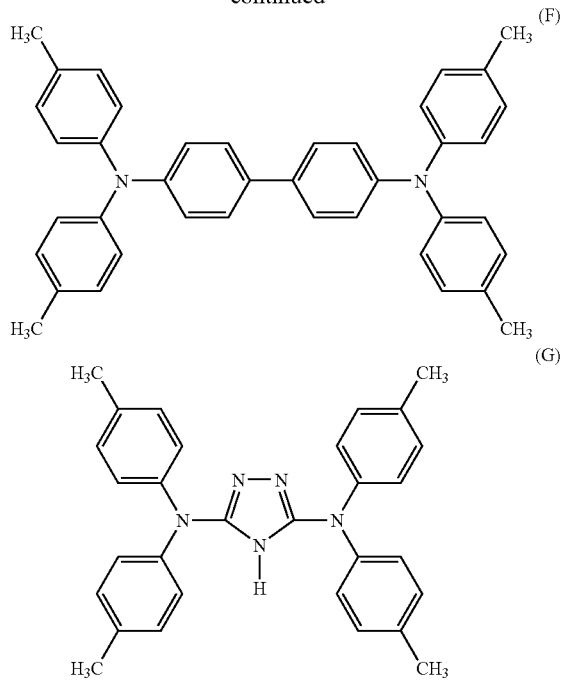

2. Manufacture of EL Device

Five organic EL devices were manufactured in each of the following Examples and Comparative Examples.

Example 1

Preparation of Hole Transport Layer Formation Material

The compound (A) was used as the hole transport material and isophthalic hydrazide was used as a heat polymerization initiator, and the compound (A) and the isophthalic hydrazide in a weight ratio of 50:1 were mixed in a xylene solution to prepare a hole transport layer formation material.

<Manufacture of Organic EL Device>

1A First, an ITO electrode (that is, an anode) was formed on a transparent glass substrate having an average thickness of 0.5 mm by vacuum evaporation so as to have an average thickness of 100 nm.

2A Next, the hole transport layer formation material was applied onto the ITO electrode by a spin coating method, and then the solvent was removed to form a coating layer.

3A Next, the thus formed coating layer was subjected to a heat treatment in an atmosphere at a temperature of 100° C. for 30 minutes so that the coating layer became a semi-solid state.

4A Next, an AlLi electrode (that is, a cathode) was formed on a transparent glass substrate having an average thickness of 0.5 mm by vacuum evaporation so as to have an average thickness of 300 nm.

5A Next, on the thus formed cathode, a xylene solution of the compound (G) was applied by a spin coating method, and then it was dried to form an electron transport layer having an average thickness of 20 nm.

6A Next, on the thus formed electron transport layer, a xylene solution of the compound (H) was applied by a spin coating method, and then it was dried to form a light emitting layer having an average thickness of 50 nm.

7A Next, the hole transport layer formation material was applied onto the thus formed light emitting layer by a spin coating method, and then the solvent was removed to form another coating layer.

8A Next, the thus formed another coating layer was subjected to a heat treatment in an atmosphere at a temperature of 100° C. for 30 minutes so that the coating layer became a semi-solid state.

9A Next, the semi-solid state coating layer on the anode and the semi-solid state coating layer on the light emitting layer were approached to each other in a face to face manner so that these coating layers were made contact with each other.

10A Next, the thus obtained semimanufacture product was subjected to a heat treatment in an atmosphere at a temperature of 150° C. for 50 minutes with the state that the coating layers were in contact with each other so that these coating layers were integrated or united together to thereby form a hole transport layer having an average thickness of 50 nm.

11A Next, an ultraviolet curing resin was supplied by an ink-jet method so as to cover the side surfaces of the thus formed laminated layers, and then the resin was cured by irradiation of ultraviolet rays to seal the layers to thereby manufacture organic EL devices each having a structure as shown in the following Table 1.

TABLE 1

| Substrate | Order Of Lamination | Electrodes and Semiconductor Layers | Constituent Material |
|---|---|---|---|
| Glass Substrate | 1 | Cathode | AlLi |
| | 2 | Electron Transport Layer | Compound (G) |
| | 3 | Light Emitting Layer | Compound (H) |
| | 4 | Layer to be Integrated | Compound (A) |
| (Layer Formed by Integration of Layers: Hole Transport Layer) | | | |
| Glass Substrate | 2 | Layer to be Integrated | Compound (A) |
| | 1 | Anode | ITO |

Example 2

Preparation of Hole Transport Layer Formation Material

The compound (A) was used as the hole transport material, diethylenetriamine was used as a curing agent, and isophthalic hydrazide was used as a heat polymerization initiator, and they were mixed in a xylene solution to prepare a hole transport layer formation material.

The mixing ratio of the compound (A) and the diethylenetriamine in a weight ratio was 10:1, and the weight ratio of the total weight of the compound (A) and the diethylenetriamine and the weight of the isophthalic hydrazide was 50:1.

<Manufacture of Organic EL Device>

Organic EL devices were manufactured in the same manner as in the Example 1 except that the hole transport layer formation material obtained in this Example was used for the formation of the coating layers in the above steps 2A and 7A, that the heat treatment in the above step 3A was carried out in an atmosphere at a temperature of 80° C. for 5 minutes, that the heat treatment in the above step 8A was carried out in an atmosphere at a temperature of 80° C. for 5 minutes, and that the heat treatment in the above step 10A was carried out in an atmosphere at a temperature of 100° C. for 10 minutes. Each of the thus manufactured organic EL devices had a structure as shown in the following Table 2.

TABLE 2

| Substrate | Order of Lamination | Electrodes and Semiconductor Layers | Constituent Material |
|---|---|---|---|
| Glass Substrate | 1 | Cathode | AlLi |
|  | 2 | Electron Transport Layer | Compound (G) |
|  | 3 | Light Emitting Layer | Compound (H) |
|  | 4 | Layer to be Integrated | Compound (A) + Curing Agent |
| (Layer Formed by Integration of Layers: Hole Transport Layer) | | | |
| Glass Substrate | 2 | Layer to be Integrated | Compound (A) + Curing Agent |
|  | 1 | Anode | ITO |

Example 3

Organic EL devices were manufactured after the hole transport material was prepared in the same manner as in the Example 1 except that the compound (B) was used as the hole transport material. Each of the thus manufactured organic EL devices had a structure shown in the following Table 3.

TABLE 3

| Substrate | Order of Lamination | Electrodes and Semiconductor Layers | Constituent Material |
|---|---|---|---|
| Glass Substrate | 1 | Cathode | AlLi |
|  | 2 | Electron Transport Layer | Compound (G) |
|  | 3 | Light Emitting Layer | Compound (H) |
|  | 4 | Layer to be Integrated | Compound (B) |
| (Layer Formed by Integration of Layers: Hole Transport Layer) | | | |
| Glass Substrate | 2 | Layer to be Integrated | Compound (B) |
|  | 1 | Anode | ITO |

Example 4

Preparation of Hole Transport Layer Formation Material

The compound (C) was used as the hole transport material and isophthalic hydrazide was used as a heat polymerization initiator, and the compound (A) and the isophthalic hydrazide in a weight ratio of 50:1 were mixed in a xylene solution to prepare a hole transport layer formation material.

<Preparation of Electron Transport Layer Formation Material>

An electron transport layer formation material was prepared in the same manner as the above-mentioned hole transport layer formation material except that the compound (D) was used as the electron transport material in stead of the hole transport material.

<Manufacture of Organic EL Device>

1B First, an ITO electrode (that is, an anode) was formed on a transparent glass substrate having an average thickness of 0.5 mm by vacuum evaporation so as to have an average thickness of 100 nm.

2B Next, the hole transport layer formation material was applied onto the ITO electrode by a spin coating method, and then the solvent was removed to form a coating layer.

3B Next, the thus formed coating layer was subjected to a heat treatment in an atmosphere at a temperature of 150° C. for 50 minutes to thereby form a hole transport layer having an average thickness of 50 nm.

4B Next, on the thus formed hole transport layer, a xylene solution of the compound (H) was applied by a spin coating method, and then it was dried to form a light emitting layer having an average thickness of 50 nm.

5B Next, the electron transport layer formation material was applied onto the thus formed light emitting layer by a spin coating method, and then the solvent was removed to form a coating layer.

6B Next, the thus formed coating layer was subjected to a heat treatment in an atmosphere at a temperature of 100° C. for 30 minutes so that the coating layer became a semi-solid state.

7B Next, an AlLi electrode (that is, a cathode) was formed on a transparent glass substrate having an average thickness of 0.5 mm by vacuum evaporation so as to have an average thickness of 300 nm.

8B Next, on the thus formed cathode, the electron transport layer formation material was applied by a spin coating method, and then it was dried to form another coating layer.

9B Next, the thus formed another coating layer was subjected to a heat treatment in an atmosphere at a temperature of 100° C. for 30 minutes so that the coating layer became a semi-solid state.

10B Next, the semi-solid state coating layer on the light emitting layer and the semi-solid state coating layer on the cathode were approached to each other in a face to face manner so that these coating layers were made contact with each other.

11B Next, the thus obtained semimanufacture product was subjected to a heat treatment in an atmosphere at a temperature of 150° C. for 50 minutes with the state that the coating layers were in contact with each other so that these coating layers were integrated or united together to thereby form an electron transport layer having an average thickness of 20 nm.

12B Next, an ultraviolet curing resin was supplied by an ink-jet method so as to cover the side surfaces of the thus formed laminated layers, and then the resin was cured by irradiation of ultraviolet rays to seal the layers to thereby manufacture organic EL devices each having a structure as shown in the following Table 4.

TABLE 4

| Substrate | Order of Lamination | Electrodes and Semiconductor Layers | Constituent Material |
|---|---|---|---|
| Glass Substrate | 1 | Cathode | AlLi |
|  | 2 | Layer to be Integrated | Compound (D) |
| (Layer Formed by Integration of Layers: Electron Transport Layer) | | | |
| Glass Substrate | 4 | Layer to be Integrated | Compound (D) |
|  | 3 | Light Emitting Layer | Compound (H) |
|  | 2 | Hole Transport Layer | Compound (C) |
|  | 1 | Anode | ITO |

Comparative Example 1

Preparation of Hole Transport Layer Formation Material

The compound (E) was used as the hole transport material, and the compound (E) was mixed in a xylene solution to prepare a hole transport layer formation material.

<Manufacture of Organic EL Device>

1C First, an ITO electrode (that is, an anode) was formed on a transparent glass substrate having an average thickness of 0.5 mm by vacuum evaporation so as to have an average thickness of 100 nm.

2C Next, the hole transport layer formation material was applied onto the ITO electrode by a spin coating method, and then the solvent was removed to form a coating layer.

3C Next, an AlLi electrode (that is, a cathode) was formed on a transparent glass substrate having an average thickness of 0.5 mm by vacuum evaporation so as to have an average thickness of 300 nm.

4C Next, on the thus formed cathode, a xylene solution of the compound (G) was applied by a spin coating method, and then it was dried to form an electron transport layer having an average thickness of 50 nm.

5C Next, on the thus formed electron transport layer, a xylene solution of the compound (H) was applied by a spin coating method, and then it was dried to form a light emitting layer having an average thickness of 20 nm.

6C Next, the hole transport layer formation material was applied onto the thus formed light emitting layer by a spin coating method, and then the solvent was removed to form another coating layer.

7C Next, the coating layer on the anode and the coating layer on the light emitting layer were approached to each other in a face to face manner so that these coating layers were made contact with each other.

8C Next, the thus obtained semimanufacture product was subjected to a heat treatment in an atmosphere at a temperature of 80° C. for 15 minutes with the state that the coating layers were in contact with each other so that these coating layers were melted to be integrated together to thereby form a hole transport layer having an average thickness of 50 nm.

9C Next, an ultraviolet curing resin was supplied by an ink-jet method so as to cover the side surfaces of the thus formed laminated layers, and then the resin was cured by irradiation of ultraviolet rays to seal the layers to thereby manufacture organic EL devices each having a structure as shown in the following Table 5.

TABLE 5

| Substrate | Order of Lamination | Electrodes and Semiconductor Layers | Constituent Material |
|---|---|---|---|
| Glass Substrate | 1 | Cathode | AlLi |
| | 2 | Electron Transport Layer | Compound (G) |
| | 3 | Light Emitting Layer | Compound (H) |
| | 4 | Layer to be Integrated | Compound (E) |
| (Layer Formed by Integration of Layers: Hole Transport Layer) | | | |
| Glass Substrate | 2 | Layer to be Integrated | Compound (E) |
| | 1 | Anode | ITO |

Comparative Example 2

Organic EL devices were manufactured after the hole transport material was prepared in the same manner as in the Comparative Example 1 except that the compound (F) was used as the hole transport material. Each of the thus manufactured organic EL devices had a structure shown in the following Table 6.

TABLE 6

| Substrate | Order of Lamination | Electrodes and Semiconductor Layers | Constituent Material |
|---|---|---|---|
| Glass Substrate | 1 | Cathode | AlLi |
| | 2 | Electron Transport Layer | Compound (G) |
| | 3 | Light Emitting Layer | Compound (H) |
| | 4 | Layer to be Integrated | Compound (F) |
| (Layer Formed by Integration of Layers: Hole Transport Layer) | | | |
| Glass Substrate | 2 | Layer to be Integrated | Compound (F) |
| | 1 | Anode | ITO |

Comparative Example 3

Preparation of Hole Transport Layer Formation Material

The compound (F) was used as the hole transport material, and a polyvinyl chloride resin in a powder form ("PVC-HA", a product name of Sekisui Chemical C., Ltd.) was used as a resin binder, and the compound (F) and the polyvinyl chloride resin in a weight ratio of 1:1 were mixed in tetrahydrofuran to prepare a hole transport layer formation material.

<Manufacture of Organic EL Device>

Organic EL devices were manufactured in the same manner as in the Comparative Example 1 except that the hole transport layer formation material obtained in this Comparative Example was used for the formation of the coating layers in the above steps 2C and 6C. Each of the thus manufactured organic EL devices had a structure as shown in the following Table 7.

TABLE 7

| Substrate | Order of Lamination | Electrodes and Semiconductor Layers | Constituent Material |
|---|---|---|---|
| Glass Substrate | 1 | Cathode | AlLi |
| | 2 | Electron Transport Layer | Compound (G) |
| | 3 | Light Emitting Layer | Compound (H) |
| | 4 | Layer to be Integrated | Compound (F) + Resin Binder |
| (Layer Formed by Integration of Layers: Hole Transport Layer) | | | |
| Glass Substrate | 2 | Layer to be Integrated | Compound (F) + Resin Binder |
| | 1 | Anode | ITO |

3. Evaluation

The current density (mA/cm$^2$), the luminous brightness (cd/m$^2$), the maximum luminous efficiency (1 m/W), and the time that elapsed before the luminous brightness became half of the initial value (that is, a half-life) of each of the organic EL devices obtained in the Examples and the Comparative Examples mentioned above were measured.

In this regard, it is to be noted that the current density and the luminous brightness were measured by applying a voltage of 6V across the ITO electrode and the AlLi electrode.

The measurement values (that is, the current density, the luminous brightness, the maximum luminous efficiency, and the half-life) of each of the Examples and the Comparative Examples were evaluated according to the following four criteria, respectively, based on the measurement values of the Comparative Example 3 as a reference.

A: The measurement value was 1.50 times or more that of the Comparative Example 3.

B: The measurement value was 1.25 times or more but less than 1.50 times that of the Comparative Example 3.

C: The measurement value was 1.00 times or more but less than 1.25 times that of the Comparative Example 3.

D: The measurement value was 0.75 times or more but less than 1.00 times that of the Comparative Example 3.

The evaluation results are shown in the following Table 8.

TABLE 8

|  | Current Density [Relative Value] | Luminous Brightness [Relative Value] | Maximum Luminous Efficiency [Relative Value] | Half-Life [Relative Value] |
|---|---|---|---|---|
| Example 1 | A to B | A | A to B | A to B |
| Example 2 | A | A | A | A |
| Example 3 | A to B | A | A to B | A to B |
| Example 4 | A to B | A to B | A to B | A to B |
| Comp. Ex. 1 | C to D | B to C | B to C | C |
| Comp. Ex. 2 | C to D | B to C | C | C to D |
| Comp. Ex. 3 | — | — | — | — |

—: The measure values of the Comparative Example 3 were used as reference values.

As shown in Table 8, all the organic EL devices of the Examples were superior to the organic EL devices of the Comparative Examples in their current density, luminous brightness, maximum luminous efficiency, and half-life.

From these results, it has been supposed that according to the organic EL devices of the present invention, excellent adhesion could be obtained between the bonding surfaces of the semiconductor layer (that is, the hole transport layer and the electron transport layer of the above Examples) which were formed by integrating or uniting the two layers together.

Further, it has also been found that since impurities such as a resin binder were not contained in the layers to be integrated together, deterioration of the characteristics of the organic EL devices was satisfactorily prevented.

Furthermore, it has also been found from the Example 2 that the organic EL devices each having the hole transport layer in which the hole transport material was effectively polymerized at the bonding surfaces of the layers due to the addition of the curing agent exhibited especially superior current density, luminous brightness, maximum luminous efficiency, and half-life.

In addition to the above Examples, organic EL devices were manufactured in the same manner as the Examples 1 to 4 except that the compound (A1) or the compound (A2) in which the functional group of each polymerizable group X was changed from the epoxy group to an acryloyl group or a styrene group was used. These organic EL devices were evaluated according to the above evaluation methods, and in these organic EL devices substantially the same results as those mentioned above could also be obtained.

Further, organic EL devices were manufactured using semiconductor materials obtained by introducing the polymerizable groups X to various compounds, and in these organic EL devices substantially the same results as those mentioned above could also be obtained.

The invention claimed is:

1. A method of manufacturing a semiconductor element having a first electrode, a second electrode, and a semiconductor layer provided between the first electrode and the second electrode, the method comprising the steps of:

a first step for forming layers mainly comprised of a semiconductor material having polymerizable groups on the side of one surface of the first electrode and on the side of one surface of the second electrode, respectively, and a second step for obtaining the semiconductor layer by integrating the two layers together by polymerizing the semiconductor materials via a polymerization reaction through their polymerizable groups in a state that the layer on the side of the first electrode and the layer on the side of the second electrode are made contact with each other, wherein the semiconductor material is comprised of a compound which is represented by the following general formula (A1) or (A2):

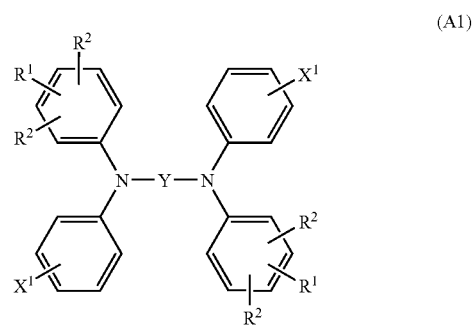

(A1)

wherein two $R^1$s are the same or different and each independently represents a straight-chain alkyl group having 2 to 8 carbon atoms, and four $R^2$s are the same or different and each independently represents a hydrogen atom, a methyl group or an ethyl group, Y represents a group containing at least one substituted or unsubsituted aromatic hydrocarbon ring or substituted or unsubstituted heterocycle, and two $X^1$s are the same kind of substituent represented by any one of the following general formulas (B1) to (B3), in which the number of carbon atoms of the two $X^1$s are the same as or different from to each other; or

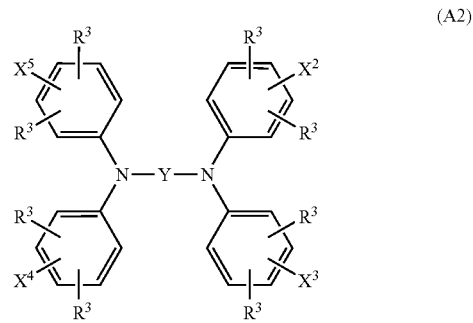

(A2)

wherein eight $R^3$s are the same or different and each independently represents a hydrogen atom, a methyl group, or an ethyl group, Y represents a group containing at least one substituted or unsubstituted aromatic hydrocarbon ring or substituted or unsubstituted heterocycle, and $X^2$, $X^3$, $X^4$ and $X^5$ are the same kind of substituent which is represented by any one of the following general formulas (B1) to (B3), in which the number of carbon atoms of $X^2$, $X^3$, $X^4$ and $X^5$ are the same as or different from to each other,

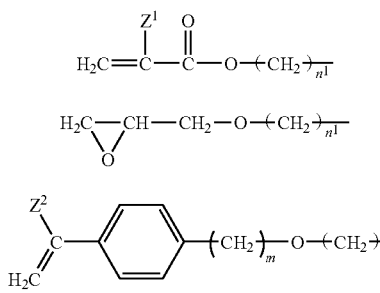

wherein $n^1$ is an integer of 2 to 8, $n^2$ is an integer of 3 to 8, m is an integer of 0 to 3, $Z^1$ represents a hydrogen atom or a methyl group, and $Z^2$ represented a hydrogen atom, a methyl group or an ethyl group.

2. The semiconductor element manufacturing method as claimed in claim 1, wherein the layer on the side of the first electrode is formed by means of a liquid phase process in the first step.

3. The semiconductor element manufacturing method as claimed in claim 1, wherein the layer on the side of the second electrode is formed by means of a liquid phase process in the first step.

4. The semiconductor element manufacturing method as claimed in claim 1, further comprising between the first step and the second step a step for polymerizing the semiconductor material contained in the layer on the side of the first electrode to such an extent that the degree of polymerization thereof is lower than the degree of polymerization of the polymer obtained in the second step.

5. The semiconductor element manufacturing method as claimed in claim 1, further comprising between the first step and the second step a step for polymerizing the semiconductor material contained in the layer on the side of the second electrode to such an extent that the degree of polymerization thereof is lower than the degree of polymerization of the polymer obtained in the second step.

6. The semiconductor element manufacturing method as claimed in claim 1, wherein the polymerizable groups have photopolymerization properties.

7. The semiconductor element manufacturing method as claimed in claim 1, wherein the polymerizable groups have heat polymerization properties.

8. The semiconductor element manufacturing method as claimed in claim 7, further comprising a step for forming at least one organic material layer which is different from the semiconductor layer between the first electrode and the second electrode, wherein a heating temperature for polymerizing the polymerizable groups is set to a temperature which is lower than a glass transition temperature of a main material constituting the organic material layer.

9. The semiconductor element manufacturing method as claimed in claim 1, wherein the semiconductor layer includes a hole transport layer.

10. The semiconductor element manufacturing method as claimed in claim 1, wherein the semiconductor layer includes a light emitting layer.

11. The semiconductor element manufacturing method as claimed in claim 1, wherein the semiconductor layer includes an electron transport layer.

12. A semiconductor element manufactured by the semiconductor element manufacturing method defined in claim 1.

13. An electronic device provided with the semiconductor element defined in claim 12.

14. Electronic equipment provided with the electronic device defined in claim 13.

* * * * *